United States Patent [19]
Watkins et al.

[11] Patent Number: 5,166,629
[45] Date of Patent: Nov. 24, 1992

[54] DIRECT FREQUENCY SYNTHESIZER

[75] Inventors: Grant H. Watkins, Dunkirk; John P. Muhlbaier, Joppa, both of Md.

[73] Assignee: Westinghouse Electric Corp., Pittsburgh, Pa.

[21] Appl. No.: 714,403

[22] Filed: Apr. 26, 1991

[51] Int. Cl.$^5$ ............................. H03B 19/00
[52] U.S. Cl. ............................. 328/14; 364/721; 307/529
[58] Field of Search ............... 328/14, 15, 134; 307/529, 271; 364/721, 718, 719, 720

[56] References Cited

U.S. PATENT DOCUMENTS

| | | | |
|---|---|---|---|
| 4,185,247 | 1/1980 | Harrison, Jr. .................. | 328/165 |
| 4,365,201 | 12/1982 | Scott et al. ..................... | 328/61 |
| 4,558,282 | 10/1985 | Lowenschuss ................. | 364/721 |
| 4,725,786 | 2/1988 | Papaieck ....................... | 328/14 |
| 4,878,027 | 10/1989 | Carp et al. ..................... | 328/15 |

Primary Examiner—Stanley D. Miller
Assistant Examiner—Sinh N. Tran
Attorney, Agent, or Firm—W. G. Sutcliff

[57] ABSTRACT

A direct frequency synthesizer is provided with a single stage or multiple cascaded stages. Each stage includes a fixed frequency input channel and a selectable frequency input channel which are coupled respectively to the I and L ports of a mixer. The input channel includes a divider having a divisor equal to N. The selectable frequencies range from $f_1$ to $f_1 + j\theta$. Single-pole-multiple-throw switches selectively connect the fixed and selectable frequencies to the mixer to generate output frequency signals through an output filter bank. Specific relationships among N, n and $\theta$ are used to establish continuous output frequency coverage, stage cascadability and other synthesizer operating features.

28 Claims, 35 Drawing Sheets

FULL OVERLAP - EQUATIONS A & F

FULL OVERLAP - EQUATION E

1X2 MIXING PRODUCTS ARE ALLOWED IN BAND

FILTER REQUIREMENTS

POSITION 1:L=6000.7000.9000

POSITION 2:L=600.800.900

POSITION 3:L=500.700.800.1000

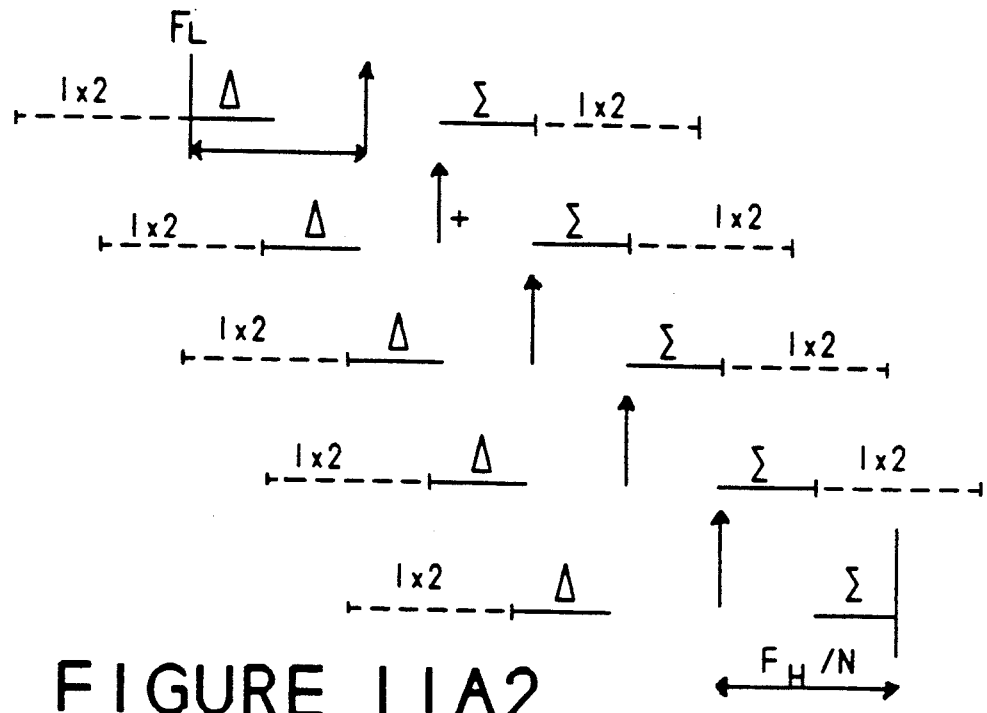
FIGURE 11A2
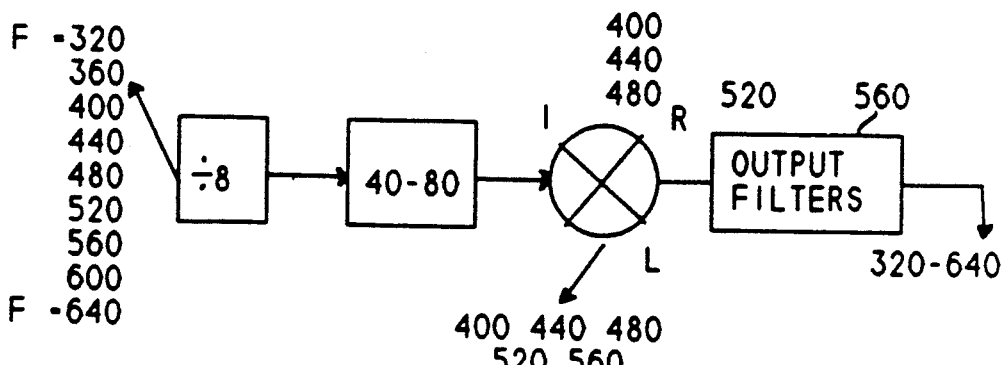
FIGURE 11A1

FIGURE 11B2
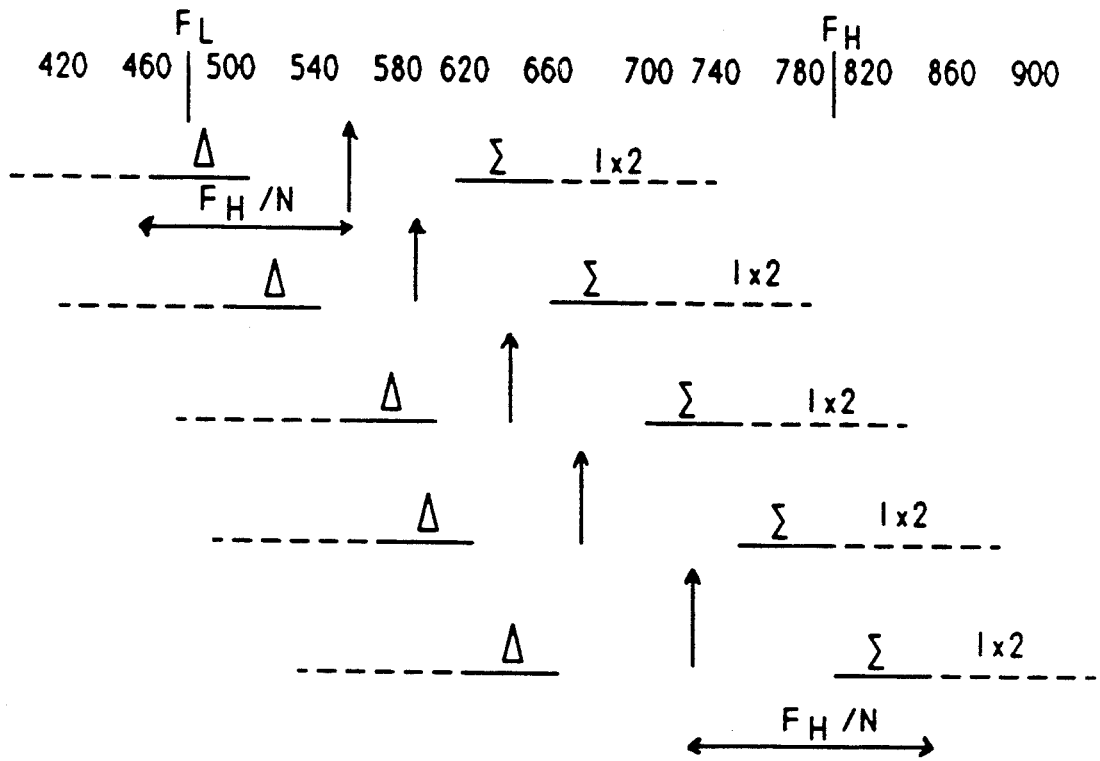
FIGURE 11B1
FULL OVERLAP 0-40. N=8 n=5: TUNES. 460 TO 820 WITH 5 LO FREQUENCIES
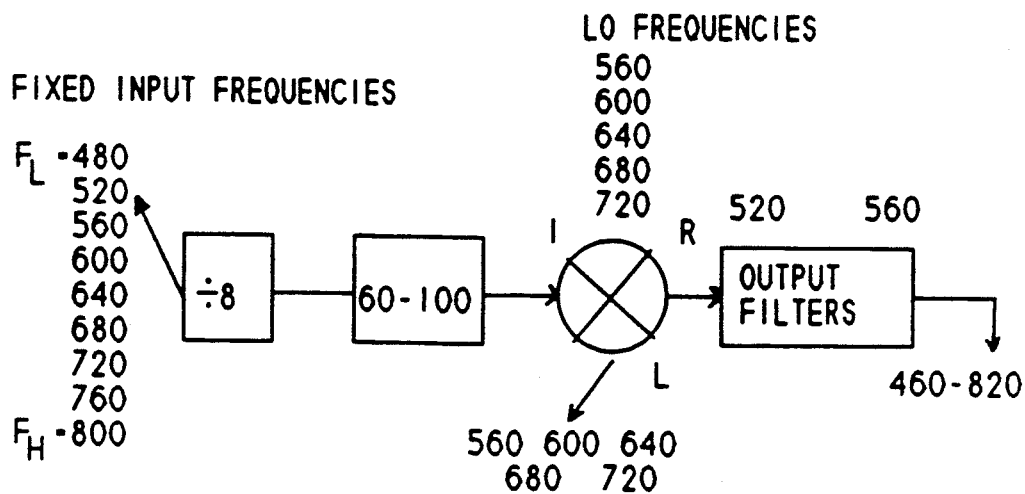

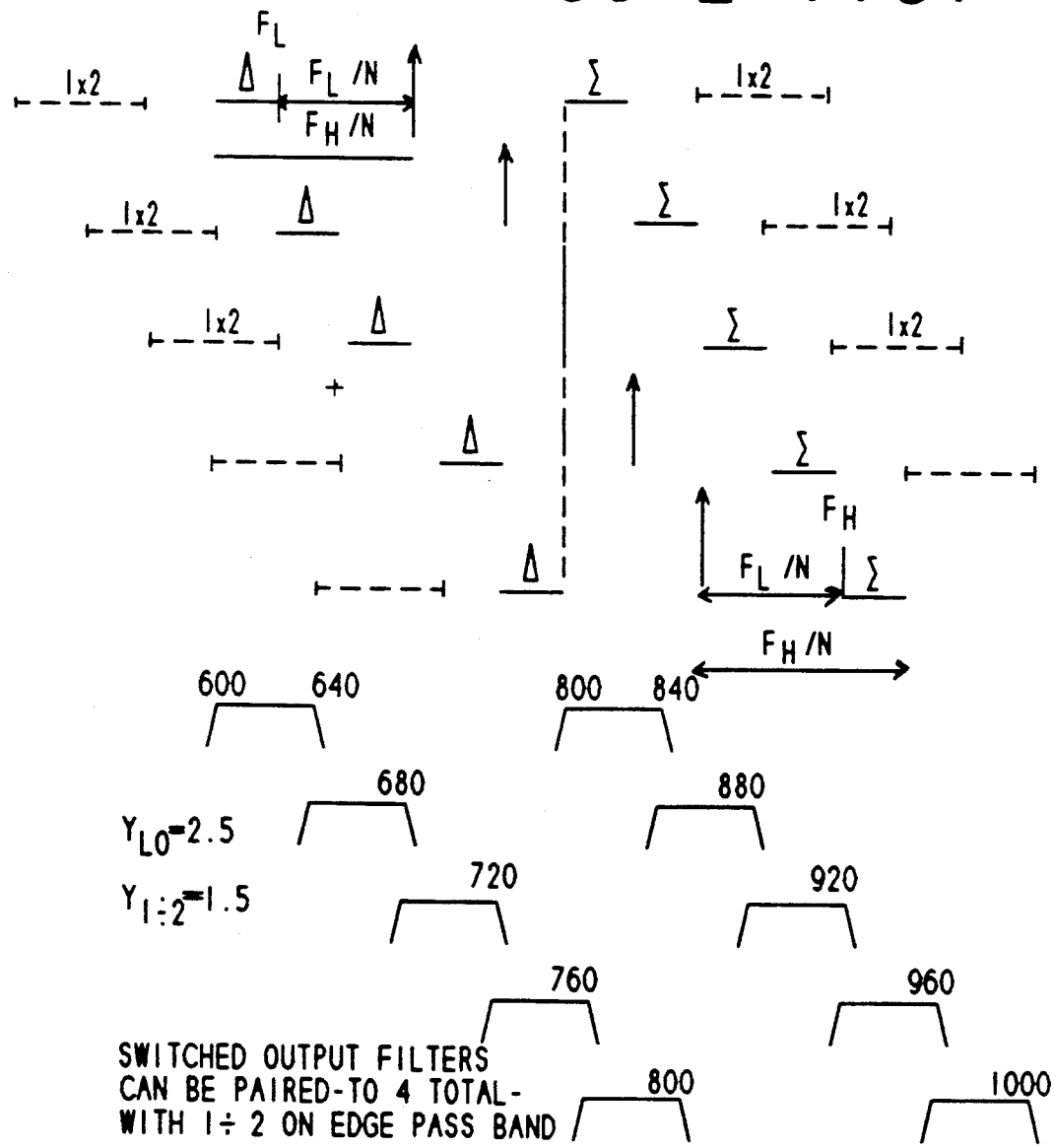
FIGURE 11C1
FIGURE 11C2

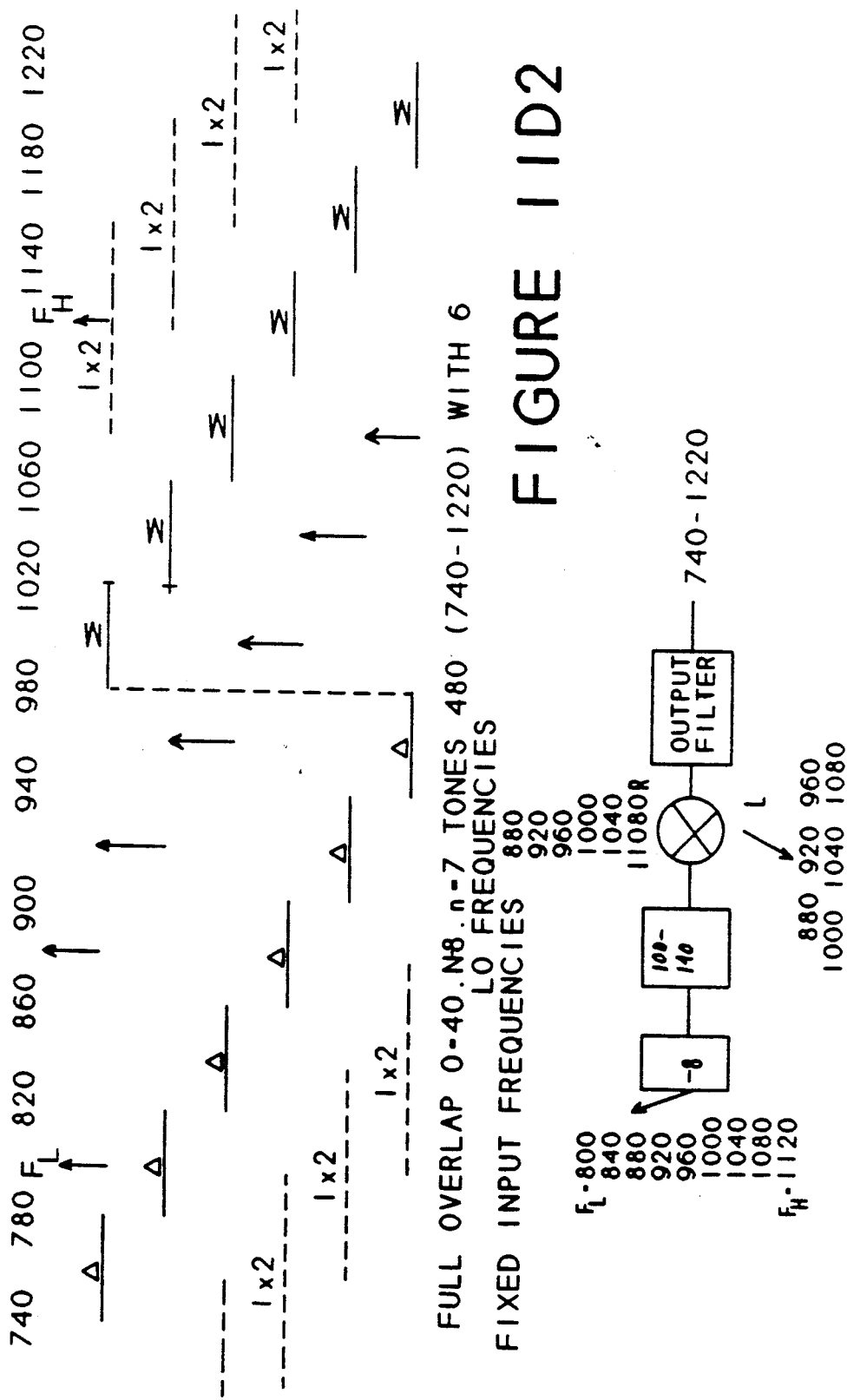

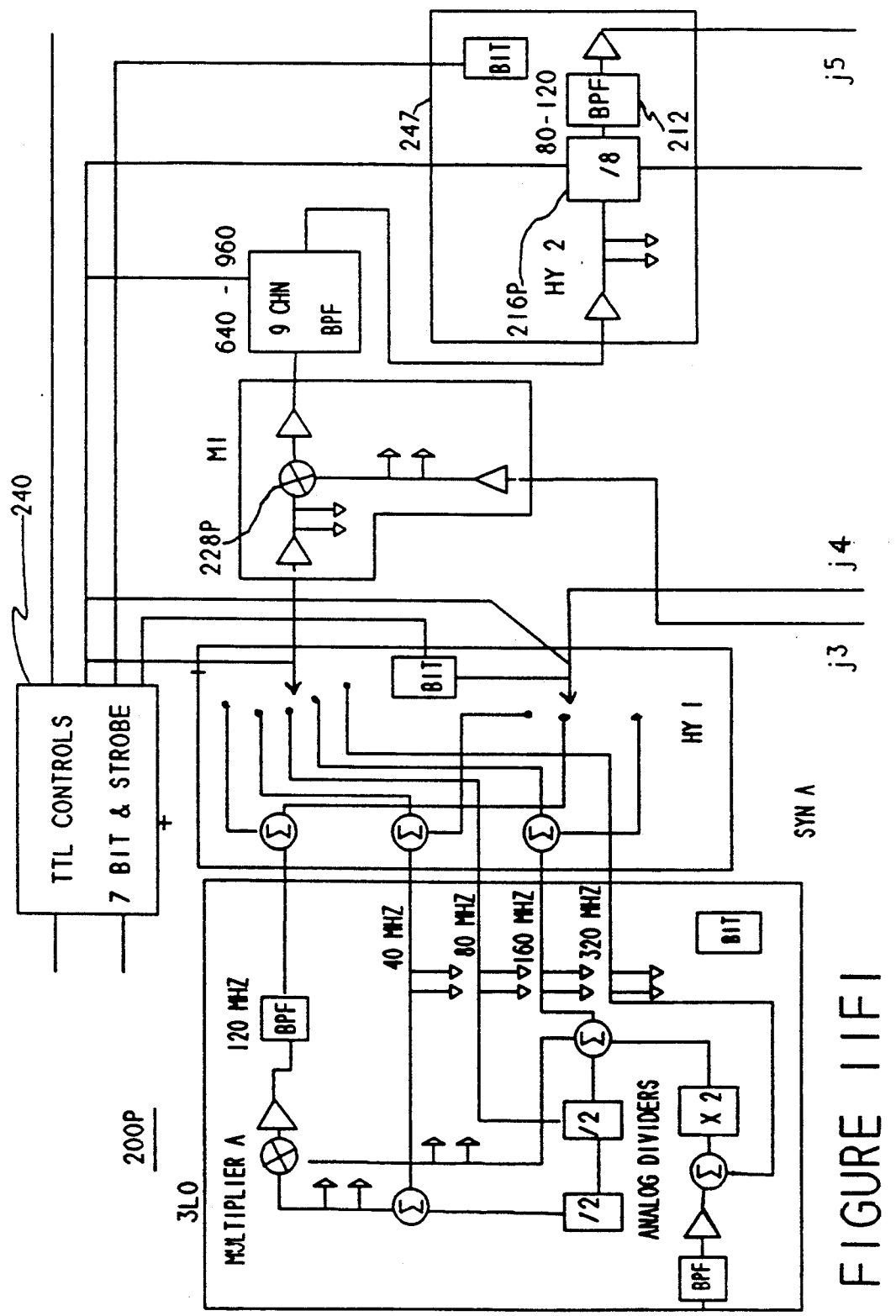
FIGURE 11F1

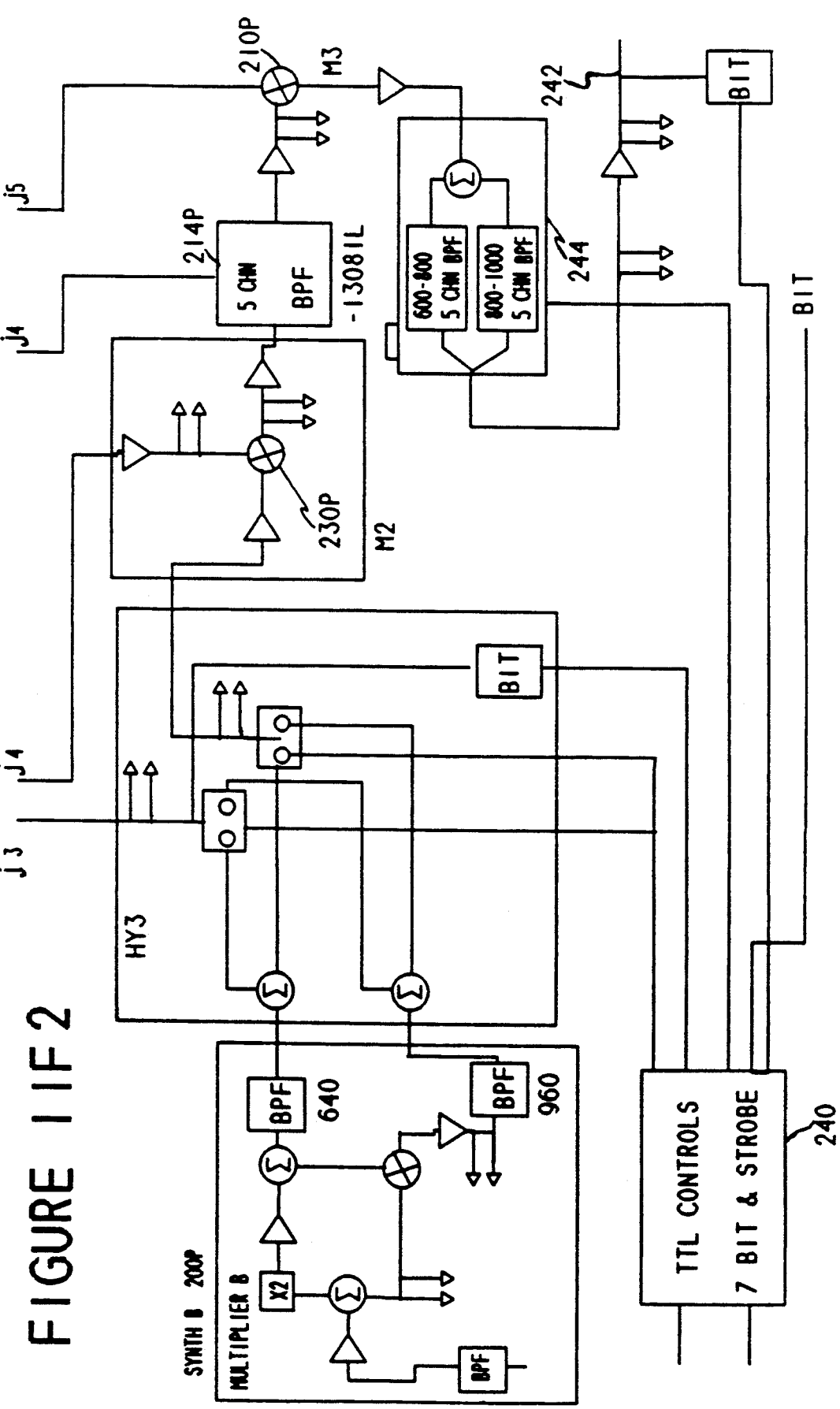
FIGURE 11F2

FULL OVERLAP PATTERN OF FIGURE 8B WITH HIGH F1

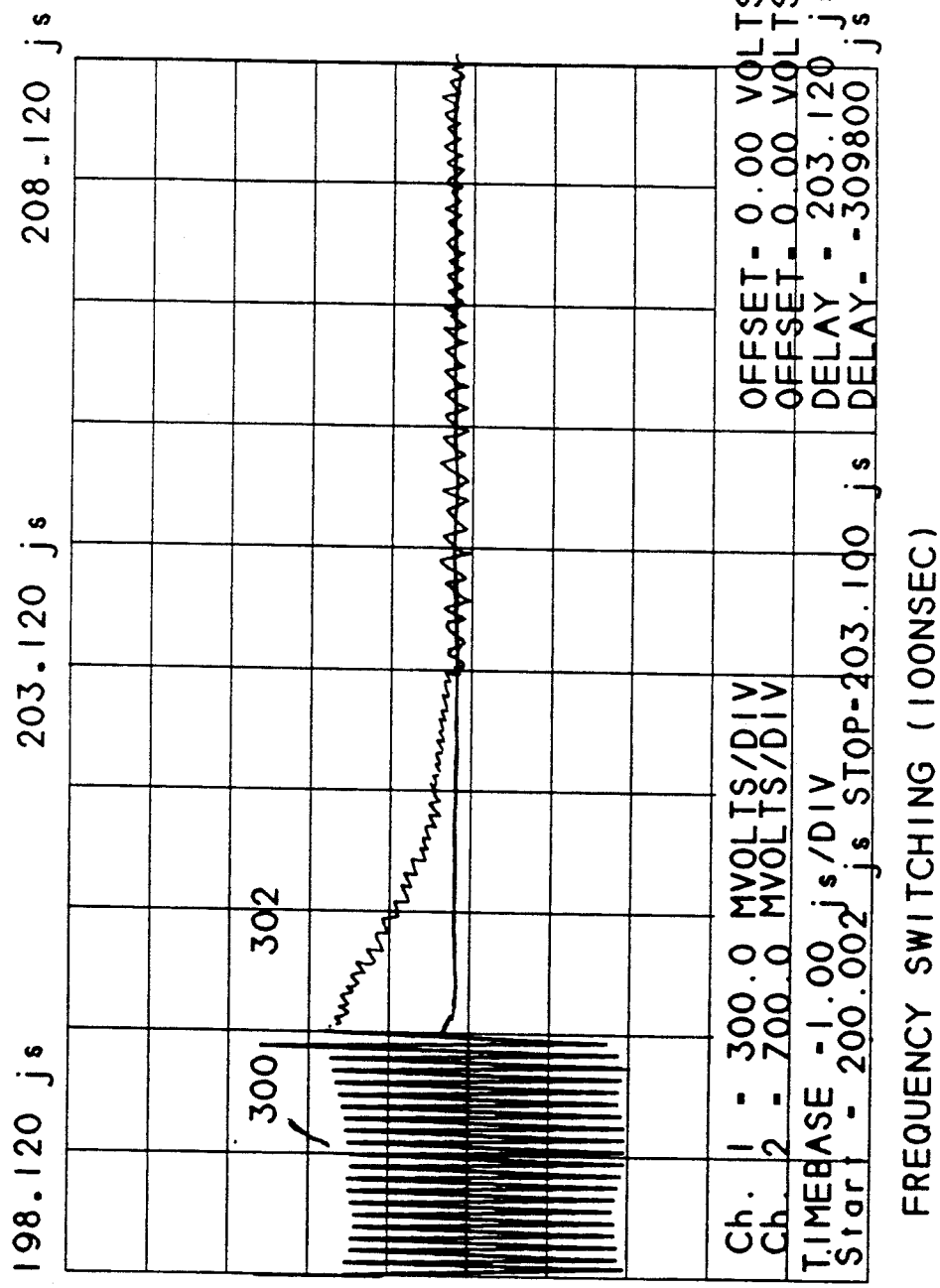

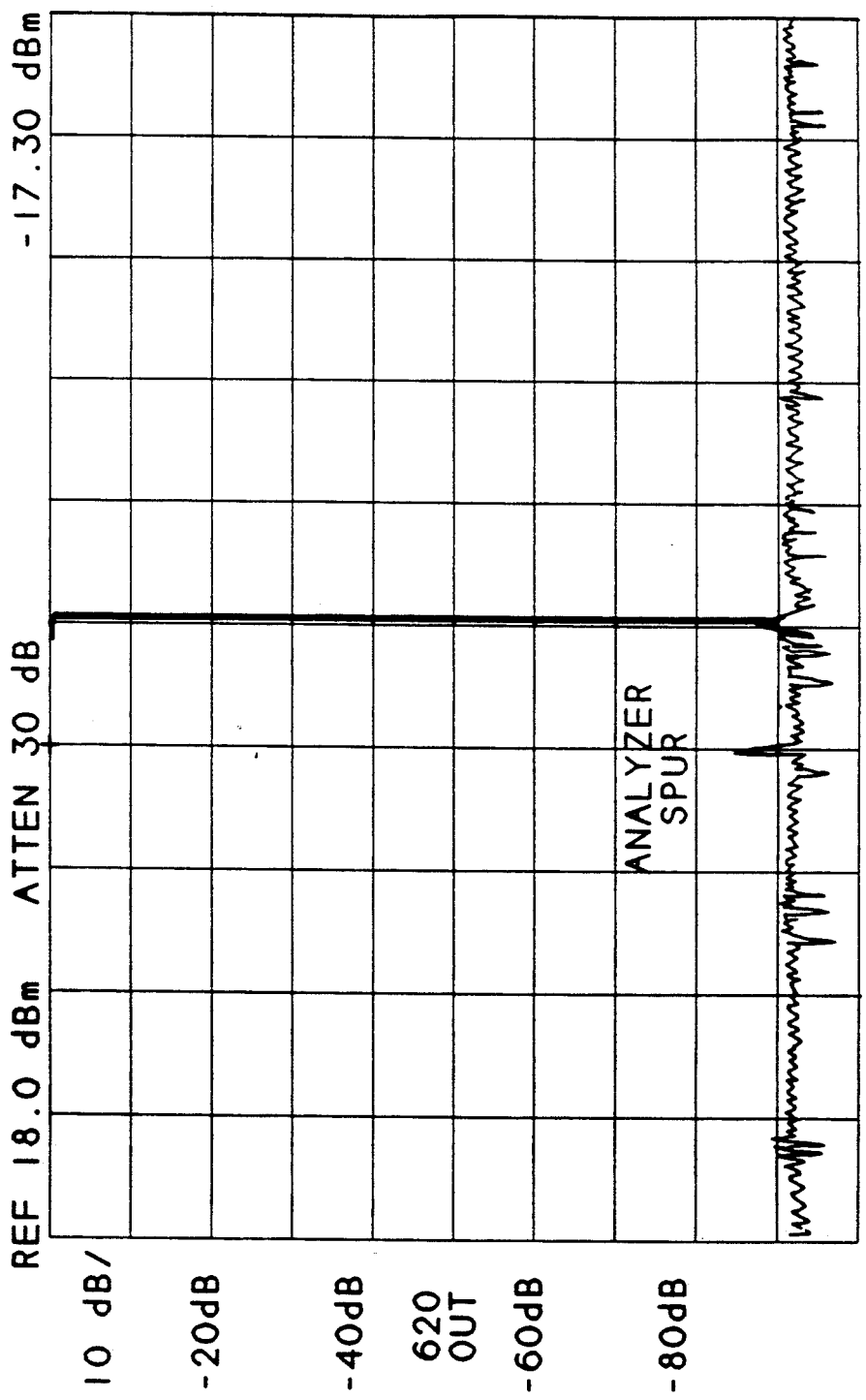

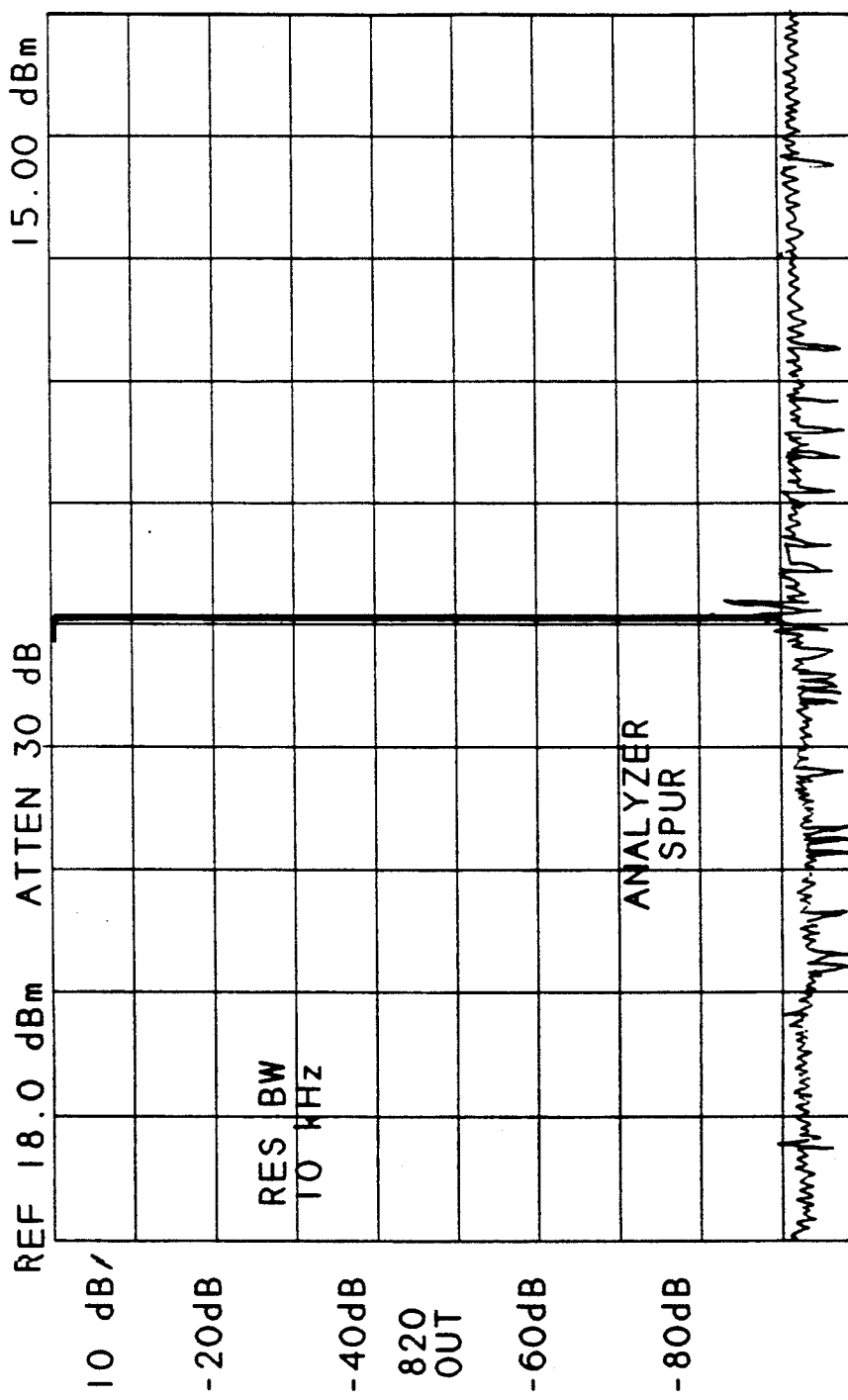

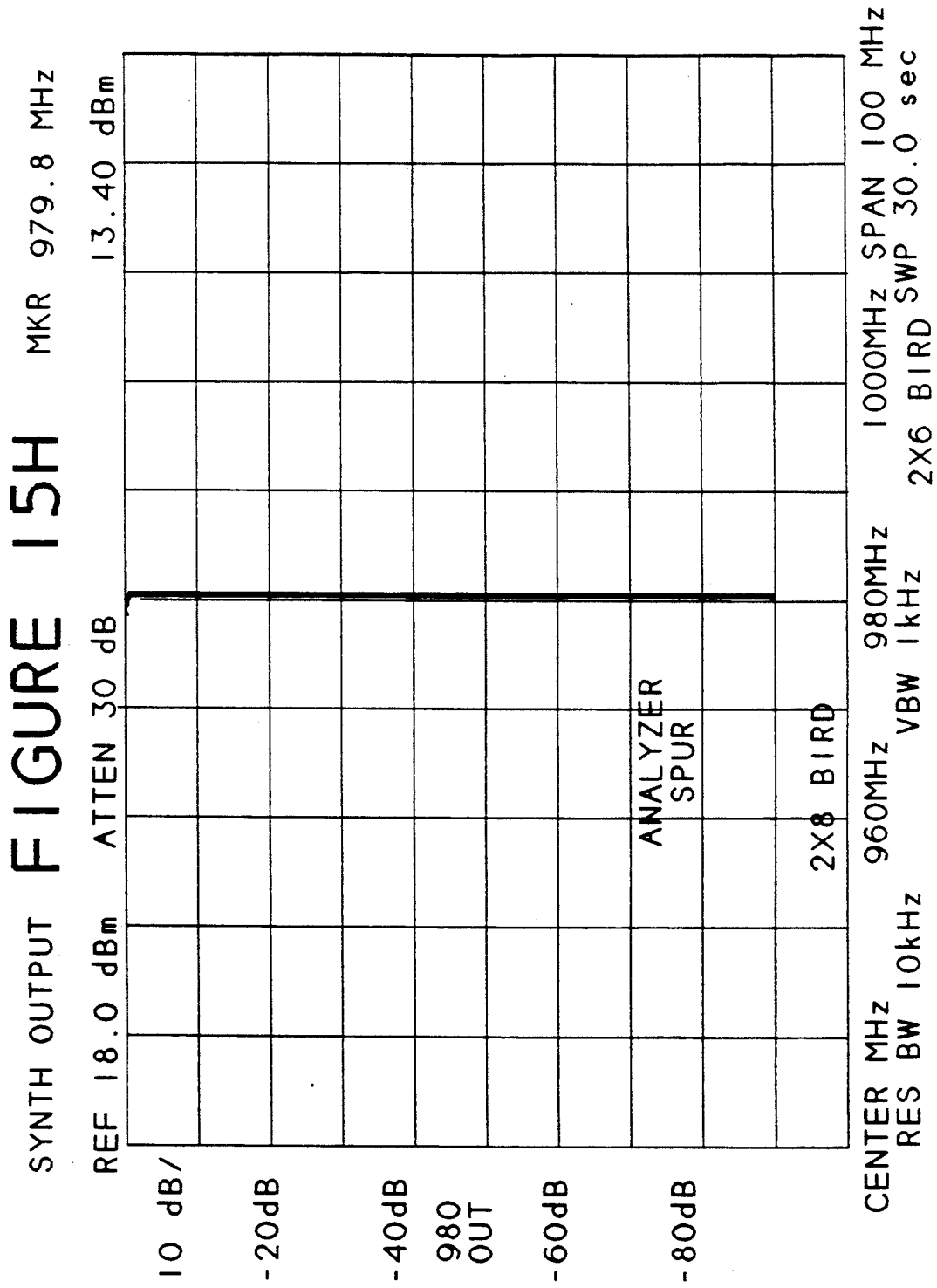

DIRECT FREQUENCY SYNTHESIZER

BACKGROUND OF THE INVENTION

The present invention relates to radar and communications systems and more particularly to frequency synthesizers employed therein.

In radar systems, the frequency of the transmitted signal may be varied within the frequency range for which the radar system is designed. Different transmitting frequencies are needed to enable the radar system to detect different targets that have different resonant frequencies. The radar transmitting frequency may also be varied within the frequency range of the radar system to escape electronic jamming.

Communication systems may also employ variable frequency transmission. Changes can thus be made in the transmitting frequency to provide stability of reception or simply to change the channel over which system broadcasting occurs.

Frequency synthesizers have been and are now employed to generate variable transmission frequencies for radar and communication systems. Various synthesizer circuit designs have been developed in the past to meet radar or communication system needs An indirect synthesizer design is one design concept that has been commonly employed in prior frequency synthesizers.

In the indirect synthesizer, at least one phase lock loop is used for frequency generation within a limited frequency range. Most phase lock loops employ a voltage controlled oscillator (VCO), a phase detector and a variable divider.

In older and/or simpler designs, the variable or programmable divider is typically employed in a feedback loop to vary the frequency output indirectly. An input frequency signal $f_i$ is applied to a phase detector from a system master oscillator which is used to lock all system components together for system frequency and phase stability. The desired output frequency $f_o$ is reached when phase lock occurs, that is when the input frequency $f_i$ equals the output frequency divided by the divisor N.

The sensitivity of a radar system to target return signals is highly dependent on the phase noise and spur (spurious signals) characteristics of the frequency synthesizer used in the radar system. Generally, the return signal is characterized with a Halford envelope that defines the phase noise amplitude to each side of the transmit or center frequency and within the return frequency scan range (up to 300 KHz or more).

The highest amplitude phase noise is near the center frequency and the phase noise decreases in amplitude toward the noise floor to each side of the center frequency. If the radar phase noise is greater in amplitude than the target signal, the target signal cannot be distinguished. To provide increased radar system capability for identifying lower radar cross-section targets, it is necessary that radar phase noise be further reduced. Accordingly, it is highly desirable that phase noise generated by radar frequency synthesizers be minimized.

Similarly, spur signals generated by the frequency synthesizer may result in spurs in the radar return signal within the Halford envelope. If the amplitude of a return spur exceeds the phase noise amplitude, a target identification interference is created. Accordingly, it is also highly desirable to minimize spurious signals generated by radar frequency synthesizers.

Indirect frequency synthesizers have generally been unable to meet the needs of advancing radar and communications system technology. Thus, in addition to the need to operate with very low phase and spurious noise, frequency synthesizers desirably should have the capability to change frequency over large bandwidths at a very rapid rate.

Phase noise performance of the indirect synthesizer with a programmable frequency divider in the feedback path has been poor, particularly since divider phase noise is multiplied in most indirect synthesizer designs. Further, the fastest of the typical indirect synthesizers have slow switching speeds on the order of milliseconds. Many indirect synthesizers even have difficulty in generating frequencies over a single octave due to voltage controlled oscillator limitations.

In more recent indirect frequency synthesizers, loop filtering of spurs has been improved and phase noise has been reduced through use of a calibrated digital/analog input voltage control circuit instead of the conventional feedback voltage divider. Switching time has been reduced to about ten microseconds and phase noise has been reduced to the point where the limiting factor has become the noise of the voltage controlled oscillator itself. Typical X-Band radars have $-120$ dbc per Hz phase noise floors with $-80$ dbc in band spurs.

From an overall perspective, the basic indirect frequency synthesizer design appears to have reached a development limit with respect to reducing phase and spurious noise and switching time. In fact, increasing product complexity itself has led to additional internal noise sources and further has resulted in more complicated and expensive maintenance procedures.

The direct frequency synthesizer design has provided additional possibilities for improvement although the realization of actual improvements has been limited. Thus, the direct frequency synthesizer design offers the possibility of producing better product performance, especially shorter switching times and lower phase and spurious noise, while simultaneously providing design simplicity that enhances product reliability and reduces product cost.

In the direct frequency synthesizer, a set of input frequency signals differ from each other by a fixed increment and are derived from a single master oscillator and beat against a second set of frequency signals in a first stage mixer. A larger set of frequency signals are generated at the output of the first stage, with the output signals differing from each other by a smaller fixed increment. A second and additional stages can be cascaded to the first stage and similarly structured and operated to produce a final output frequency signal that is selected by switchable filters.

Many prior direct synthesizer designs are limited to single-stage circuits which are limited in frequency generation capability. The conventional "mix-and-divide" direct synthesizers do use cascaded stages but are nonetheless essentially limited to narrow bandwidth operation. Typically, only the sum sideband is passed from the mixer output by a single output filter and the divider N is essentially limited to 4 because problems are encountered with use of higher N values.

Expansion of the bandwidth of mix-and-divide synthesizers requires additional fixed frequency inputs. In turn, the output filter skirt becomes limiting and rejection of the added frequencies requires additional filters. Thus, bandwidth expansion is possible but the resulting mix-and-divide circuitry soon becomes highly complex.

In any case, spur and phase noise performance of mix-and-divide synthesizers has been inadequate to meet state-of the-art requirements.

R. J. Papaieck U.S. Pat. No. 4,725,786 entitled "FULL-OCTAVE DIRECT FREQUENCY SYNTHESIZER" and issued on Feb. 16, 1988 (hereinafter referred to as the 786 patent) provides some improvement over previous art, and is perhaps representative of the current state of the art for cascaded direct frequency synthesizers. Generally, the 786 patent discloses a direct frequency synthesizer that has cascaded stages, specifically ten stages, and operates with limited improvement in switching time and spur and phase noise performance.

The 786 cascaded circuit design is directed to achieving full octave bandwidth for a specific frequency range, i.e. 500 MHz to 1000 MHz, with use of a specific divider ratio 10. Further, mixer, filter, and switching circuitry is made relatively complex to produce a continuous full-octave frequency generation capability. Some of the stages have like circuit designs, but other stages disadvantageously have different circuit designs needed to meet specific mixing, filtering and switching requirements.

Overall, the 786 patent is structured to a specific divider ratio (10) and provides no basic disclosure nor direction for structuring direct frequency synthesizers to implement output frequency plans that fall within a frequency range that is much broader than the 786 output frequency range. Finally, to the extent that the 786 disclosure may be extrapolated to other frequency range applications, it nonetheless has limited switching time and spur and phase noise performance and is encumbered with the described circuit complexities which detract from product reliability, efficiency and economy.

SUMMARY OF THE INVENTION

A direct frequency synthesizer includes a source for a set of fixed input frequency signals and a source for a set of selectable frequency signals. The input signals are applied through divider means having a divisor equal to N. The selectable frequency signals are spaced from each other by $\theta$ and extend from $f_1$ to $(f_1+j\theta)$. The divided input signals and the selectable frequency signals are selectively coupled to mixing means which has an output coupled to output filter means. To provide continuous output frequency coverage at the filter means output, a predetermined relationship is established among N, n and $\theta$.

BRIEF DESCRIPTION OF THE DRAWINGS

The accompanying drawings, which are incorporated in and constitute a part of this specification illustrate one embodiment of the invention and together with the description provide an explanation of the objects, advantages and principles of the invention. In the drawings:

FIGS. 11A1–11D1 show respective diagrams for non-octave synthesizers embodied in accordance with the invention, with FIG. 11C1 showing an optimum full overlap synthesizer;

FIGS. 11A2–11D2 show the respective patterns that apply to the non-octave synthesizers of FIGS. 11A1–11D1;

FIGS. 11F1–11F2 is a diagram of a circuit layout for the prototype of the optimum synthesizer of FIG. 11E;

FIGS. 15A–15H show various graphs that demonstrate the improved synthesizer performance provided by the prototype unit of FIG. 11C.

DESCRIPTION OF THE PREFERRED EMBODIMENT

Figure 1:
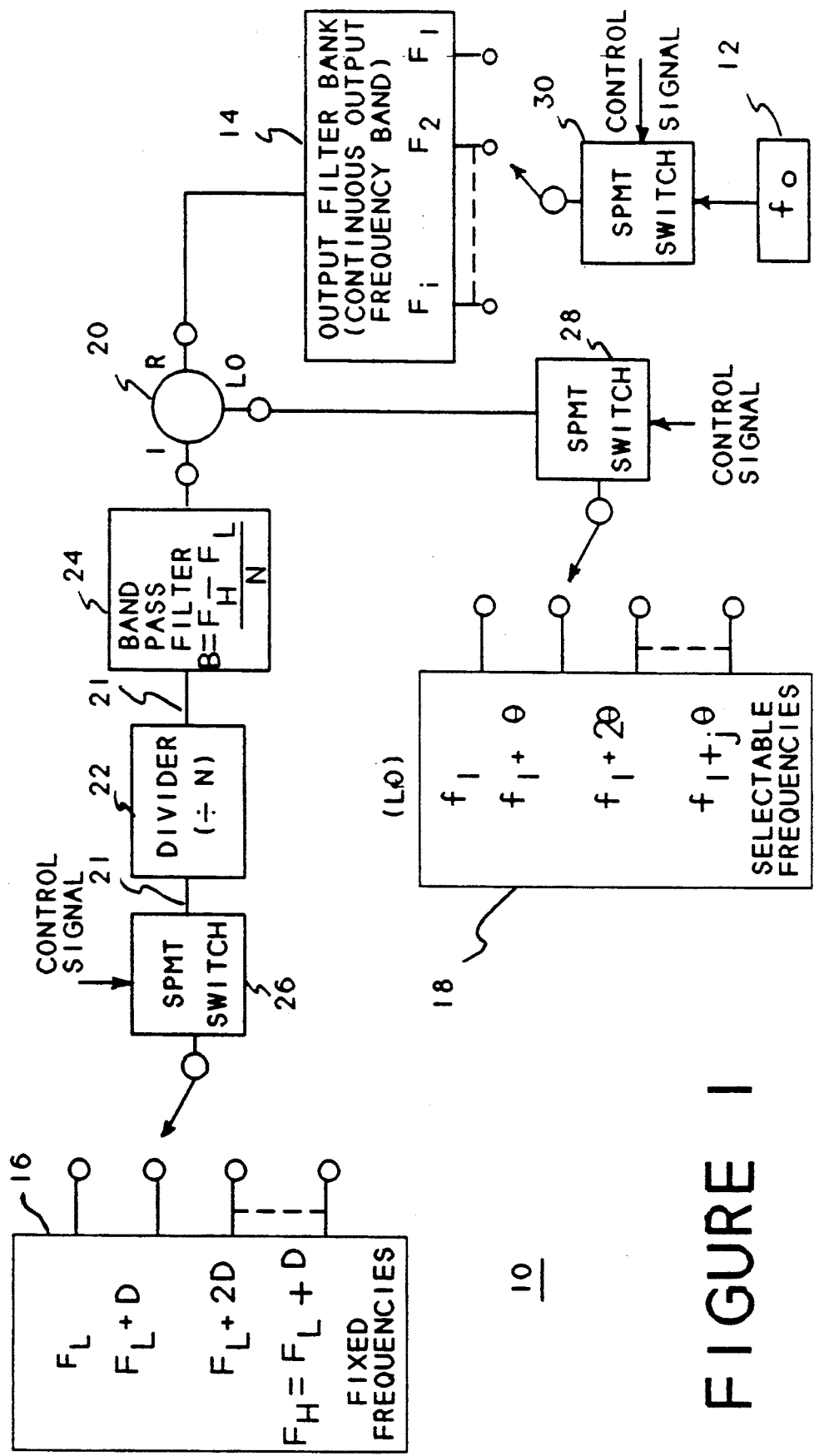
FIG. 1 shows a functional block diagram of a single-stage, direct frequency synthesizer arranged in accordance with the principles of the present invention.

A circuit arrangement 10 shown in broad block diagram form in FIG. 1 is structured and operated to function as a single stage of a direct frequency (DF) synthesizer in accordance with the principles of the invention. An output frequency signal $f_o$ in block 12 is generated within a continuous output frequency band $F_1$-$F_i$ as indicated in output filter means 14 which preferably is a filter bank that includes parallel connected filters as needed for particular synthesizer frequency plans (defined hereinafter).

The direct frequency (DF) synthesizer 10 is especially useful for radar applications because it operates with high performance that is needed for low radar cross-section applications. Thus, it operates with extremely low phase noise and extremely low spurious (spur) signal interference because its output frequency $f_o$ can be changed rapidly and accurately for ECM or other purposes.

The DF synthesizer 10 is especially advantageous since it provides highly effective performance while being characterized with relative simplicity and economy of design. The DF synthesizer circuitry is further characterized with design flexibility in the sense that any of a wide range of full-octave or nonoctave frequency plans can be readily implemented in it to operate with the described high performance while providing almost any output frequency band range that may be needed for radar or other system applications. In this way, the DF synthesizer 10 can be employed with design and manufacturing economy as a standard subsystem design for various radar and other systems. With relatively little custom engineering, the DF synthesizer can be embodied as a specific hardware structure adapted for use in a particular radar or other system application.

To generate a selected output frequency signal within the output frequency band, a fixed frequency signal selected from a set of fixed input frequency signals $F_L$ to $F_H$ from input frequency signal generating means 16 is mixed in mixing means 20 with a frequency signal selected from a set of selectable LO frequency signals $f_1$ to $f_1+j\theta$ from selectable frequency signal generating means 18. A mixer output sum signal or a mixer output difference signal is transmitted to provide the selected output frequency signal as determined by filtering in the filter bank 14. The choice of fixed and selectable frequency signals and the stage filtering to produce a specified output frequency band constitutes a "frequency plan".

The mixing means 20 preferably is provided in the form of a single conventional mixer having the normal I, LO, and R ports as shown to provide manufacturing economy and operating reliability for direct synthesizers that are structured overall in accordance with the invention to provide the described high operating performance. The frequency signal generating means 16 and 18 may be provided in various forms, but preferably is structured as subsequently described herein.

In accordance with typical practice for DF synthesizers, the output frequency band for the input generating means 16 is the same as the fixed frequency band from the filter block 14. The successive frequency signals in the set of fixed frequency signals in the generating means 16 are spaced from each other by a frequency increment D. The output frequency signals are similarly separated by an increment or step $\delta$ which is equal to D/N.

N is a divisor applied to the fixed frequency signals by a frequency divider 22. Thus, the number of selectable output frequency signals in the output frequency band from the filter block 14 is greater in number than the number of fixed frequency signals in the same frequency band from the generating means 16 as determined by the divisor N and the number of selectable LO frequencies.

The fineness of output frequency tuning in a single DF synthesizer stage is thus directly determined by the divisor N. If finer frequency tuning is desired, multiple stages can be cascaded together to provide smaller frequency steps or steps between output frequency signals in each successive DF synthesizer stage as determined by the divisor N.

In accordance with the present invention, cascaded stage synthesizers can be and preferably are formed from basically identical stages, again to provide a high performance DF synthesizer with the advantages of economy and reliability gained from simplicity and standardization of design.

The set of selectable or LO frequency signals from the generating means 18 may be the same as the fixed frequency signal set 16, and preferably they are at least within the frequency band for the fixed frequency signal set to support considerations of design simplicity. The valuation of the LO frequency signals, as well as the fixed frequency signals 16, is preferably limited to frequency values derivable from a single master oscillator frequency signal applicable to the radar or other system as a whole. Synchronous operation of the whole system is thus facilitated to support operational reliability.

Otherwise, the number and valuation of the LO frequency signals are determined in accordance with the invention principles to provide DF synthesizer operation in accordance with a frequency plan implemented by a specific synthesizer design.

In circuit path 21 for the fixed frequency signal inputs, filter means is connected in series with the frequency divider 22. The filter means 14 is preferably provided as a single filter 24 and it rejects 1) leak-through fixed frequency signals that could otherwise constitute output spurs and 2) harmonic spur signals, such as $2F_L/N$, characteristically generated by divider circuits. Incidentally, output spurs are often referred to as "birds" in the pertaining art.

The output filter bank 14 is provided with a filter pattern that produces continuous frequency output signals over the output frequency band specified by the frequency plan for the DF synthesizer. In accordance with the present invention, substantial simplification is realized in the output filtering since the number of switched filter banks required to cover a given tuning range is reduced. Simplified filtering and other advantages including low phase noise, reduced spur interference and fast frequency switching are all provided in both narrow and wide band synthesizers in accordance with the invention principles.

In implementing a frequency plan for the DF synthesizer 10, a single pole multiple throw switch 26 is employed to select a particular input frequency signal. Similarly, a single pole multiple throw switch 28 provides for selecting a particular LO frequency signal. Finally, a single pole multiple throw switch is used to select a particular filter in the block 14 for generation of the output frequency $f_o$. Various combinations of the settings of the switches 26, 28 and 30 are established by the indicated control signals and thereby provide for generation of output frequency signals $f_o$ continuously over the entire output frequency bandwidth. The term "continuously" means that an output frequency signal can be generated at each output channel location defined by the channel spacings $\delta$.

Figure 2:
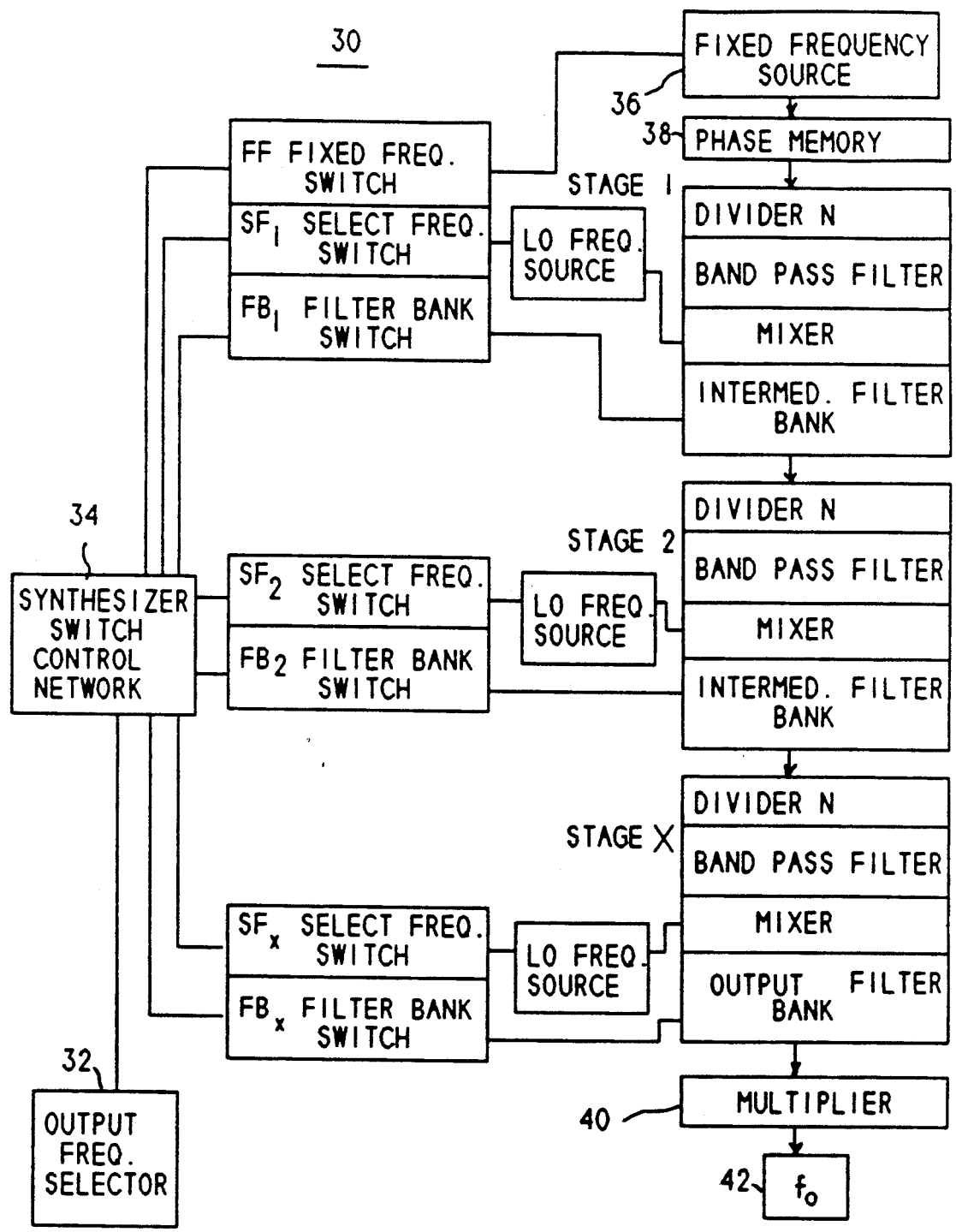
FIG. 2 shows a functional block diagram of a direct frequency synthesizer arranged in accordance with the present invention with cascaded stages like the synthesizer stage shown in FIG. 1.

In FIG. 2, there is shown a DF synthesizer 30 that more generally represents various ways in which the invention can be embodied. A system operator or an automatic ECM system or the like makes an output frequency selection through a frequency selector 32. The frequency selection is implemented by a synthesizer switch control network 34 that generates an output signal for each switch that must be set in the synthesizer 30 to produce the selected frequency output signal.

A switch logic system is embedded in the control network 34 to operate the synthesizer switches to generate any selected output frequency signal within the output frequency bandwidth in accordance with the synthesizer frequency plan. The switch logic that is executed to control frequency output is developed as considered more fully subsequently herein. Suitable means such as a programmable digital computer or a hard logic device can be used to implement the switch logic for a particular DF synthesizer design.

The DF synthesizer 30 includes one or more synthesizer stages, generally represented as Stage 1, Stage 2—through Stage x. If only Stage 1 is included and its filter bank is structured as a synthesizer output filter bank rather than an intermediate stage filter bank, the DF synthesizer 30 is then equivalent to the DF synthesizer 10 of FIG. 1. If multiple synthesizer stages are cascaded together in forming the DF synthesizer 30 for reasons already considered, it is preferred that the circuitry for all of the synthesizer stages, except the first and last stages, be essentially identical. Preferably, the first stage differs in circuitry only in that it includes the "starter" fixed frequencies source. In addition, the final stage preferably differs from other stages only in the output filter circuitry as necessitated by the particular frequency design. However, output filter circuitry of all intermediate stages is preferably alike.

A fixed frequency source 36 can have its output applied to the synthesizer Stage 1 or, as shown, it may be coupled to the synthesizer Stage 1 through a phase memory block 38 where it is important that phase memory be retained during frequency switching. Phase memory is explained more fully subsequently herein.

A selectable frequency switch SF1—SFx and a filter bank switch FB1—FBx are provided for selecting the LO frequency and the filter band pattern in each synthesizer stage. In addition, a fixed frequency switch FF is provided for the fixed frequency source 36 in advance of synthesizer Stage 1. All of the switches SF, BF and FF are set by the control network 34 in the manner described.

Generally, the DF synthesizer can be structured to be a full octave synthesizer by specifying the octave bandwidth desired for the output frequency signals and developing and structurally implementing a frequency plan appropriate to the specified bandwidth as more fully considered subsequently herein. Similar procedures are employed in structuring a nonoctave synthesizer.

A multiplier 40 is coupled between the last synthesizer stage and output 42 if it is desired in accordance with a synthesizer frequency plan to achieve the final output frequency bandwidth with hardware economy by means of a multiplication step. The multiplier 40, if employed, is preferably structured as considered more fully subsequently herein to achieve frequency multiplication without diminishing the spur and phase noise performance of the synthesizer 30 and without increasing the output step size.

STRUCTURING THE SYNTHESIZER FOR CONTINUOUS FREQUENCY OUTPUT

Development of a frequency plan for a DF synthesizer requires that continuous output frequency coverage be provided over the selected output frequency bandwidth. Thus, the fixed frequency set, the LO frequency set, the divider N and the output filter bank must be arranged to produce a set of output frequency signals (channels) that are spaced from each other by $\delta$ over the entire output frequency bandwidth.

In accordance with the present invention, a DF synthesizer is provided with basic parameter relationships that establish the conditions necessary for continuous output frequency coverage. In the general single stage case, the set of fixed frequency signals is defined as $F_L$, $F_L+D$, $F_L+2D$, —, to $F_H$ (see FIG. 1). The set of LO frequencies is defined as $f_1$, $f_1+\theta$, $f_1+2\theta$, —, to $f_1+j\theta$. Finally, the divisor factor is defined as N.

Mixing of each LO frequency with the set of fixed frequencies produces a band of difference or $\Delta$ signals and a band of sum or $\Sigma$ signals. The aggregate of these bands of signals provides the total set of frequency signals available for the output frequency bandwidth. The following tables define these signal bands:

TABLE 1

| $\Sigma$ TUNING BANDS - HALF OVERLAP ||||
|---|---|---|---|
| $\Sigma$ BAND # | LO FREQUENCY | LOW END | HIGH END |
| 1 | $f_1$ | $f_1 + F_H/N$ | $f_1 + F_H/N$ |
| 2 | $(f_1 + \theta)$ | $f_1 + \theta + F_L/N$ | $f_1 + \theta + F_H/N$ |
| 3 | $(f_1 + 2\theta)$ | $f_1 + 2\theta + F_L/N$ | $f_1 + 2\theta + F_H/N$ |
| j + 1 | $(f_1 + j\theta)$ | $f_1 + j\theta + F_L/N$ | $f_1 + j\theta + F_H/N$ |

TABLE 2

| $\Delta$ TUNING BANDS - HALF OVERLAP ||||
|---|---|---|---|
| $\Delta$ BAND # | LO FREQUENCY | HIGH END | LOW END |
| 1 | $f_1$ | $f_1 - F_L/N$ | $f_1 - F_H/N$ |
| 2 | $(f_1 + \theta)$ | $(f_1 + \theta) - F_L/N$ | $(f_1 + \theta) - F_H/N$ |
| 3 | $(f_1 + 2\theta)$ | $(f_1 + 2\theta) - F_L/N$ | $(f_1 + 2\theta) - F_H/N$ |
| j + 1 | $(f_1 + j\theta)$ | $(f_1 + j\theta) - F_L/N$ | $(f_1 + j\theta) - F_H/N$ |

Figure 3:
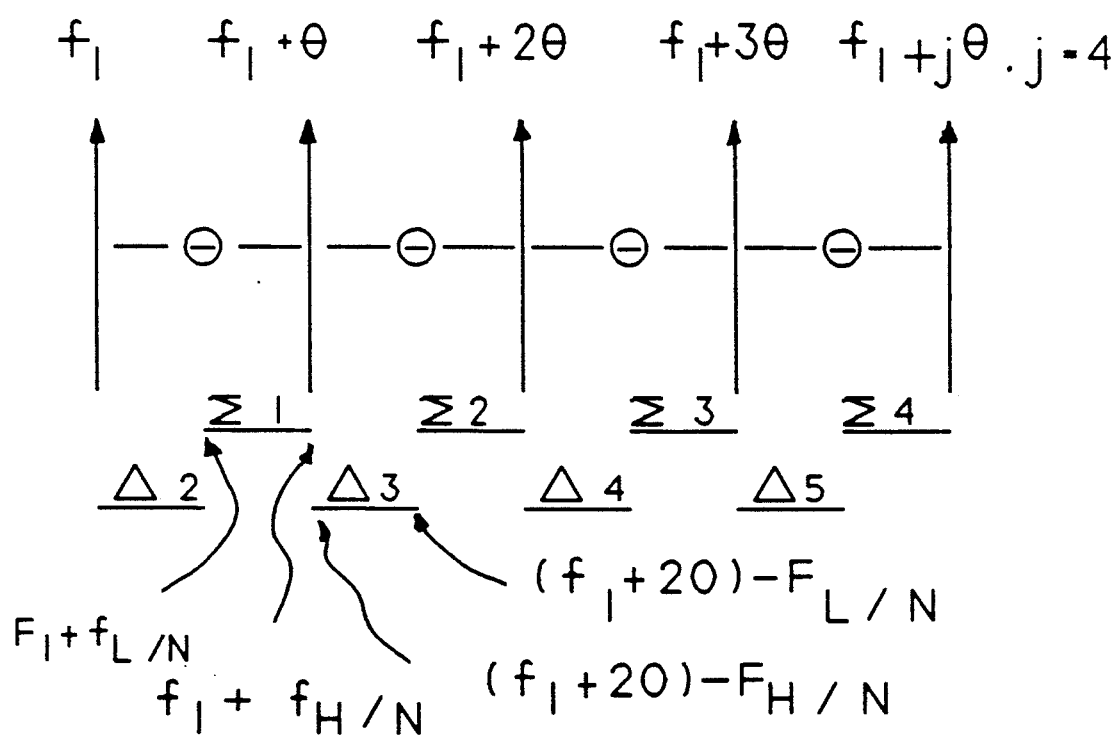
FIG. 3 shows a graph that illustrates a half overlap frequency pattern that may be employed in structuring direct frequency synthesizers in accordance with the invention.

One way to obtain continuous frequency coverage over the output frequency bandwidth is to require that the highest edge of a $\Sigma$ output band touch the lowest edge of a higher or nth $\Delta$ output band. FIG. 3 graphically illustrates the edge touching relationship of the output $\Sigma$ and $\Delta$ bands that operates as a basic condition for continuous output frequency coverage when the LO frequency spacing $\theta$ equals twice the divider output bandwidth B which equals $(F_H-F_L)/N$. This case of continuous output frequency coverage is called the "half overlap" case. In the half overlap pattern, frequency coverage is alternately provided by $\Sigma$ and $\Delta$ bands and their edges touch at fixed LO frequencies over the output frequency bandwidth. In the half overlap case, the frequency value of the high end of each $\Sigma$ band must equal the frequency value of the low end of any higher Δ band (See FIG. 3).

To obtain edge touching between the Σ and Δ bands:

HALF OVERLAP—CONDITIONS FOR CONTINUOUS OUTPUT TUNING $f_1 + F_H/N = (f_1 + n\theta) - F_H/N$ where: $n = 1, 2, 3 \ldots$, an integer that is one less than the number of the LO frequencies in the frequency span associated with the touching of the lowest edge of a Δ band and the highest edge of a Σ band.

$$2F_H/N = n\theta \quad \text{or} \quad \theta = 2F_H/nN$$

$$F_H = nN\theta/2 \qquad \text{EQUATION A}$$

Note:
in the above, the highest edge of first sum band is made "to touch" or made equal to the lowest edge of some "n th" higher difference band.

Definition of half overlap:

$$\frac{F_H - F_L}{N} = \theta/2 \quad \text{or} \quad F_H = n\theta/2 + F_L$$

$$F_H = F_L + N\theta/2 = nN\theta/2$$

$$F_L = nN\theta/2 - N\theta/2 = N\theta(n-1)/2 \qquad \text{EQUATION B}$$

Another way to obtain continuous frequency coverage over the output frequency bandwidth is to require that the adjacent high and low edges of two adjacent Σ bands touch and to require edge touching between a Σ band and a Δ band. The LO frequency spacing $\theta$ equals the divider output bandwidth B in this case, which is called the "full overlap" case. Accordingly:

$$\theta = \frac{F_H - F_L}{N} \qquad \text{EQUATION C}$$

Therefore, $$F_H = F_L + N\theta \qquad \text{EQUATION D}$$

As can be observed from equations C and D, the filter bandwidth B increases with decreasing N or increasing $\theta$. Further, as N increases with a given $\theta$, the lowest and highest fixed frequencies $F_L$ and $F_H$ and thus the output frequency band increase.

Figure 4A:
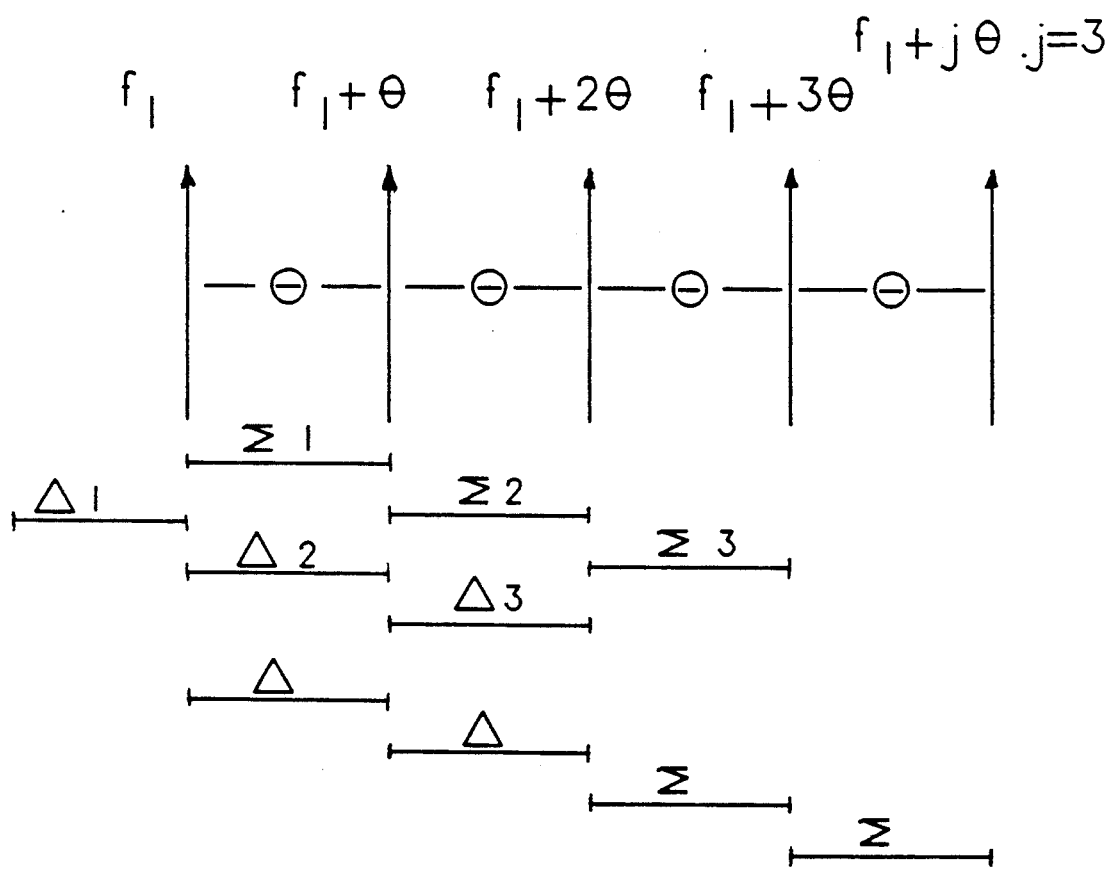
FIGS. 4A and 4B show respective graphs that illustrate a full overlap frequency pattern that may be employed in structuring direct frequency synthesizers in accordance with the invention.

FIG. 4A graphically illustrates the edge touching relationship of the output Σ and Δ bands for continuous output frequency coverage in the full overlap case. In the full overlap pattern, frequency coverage is provided by Δ bands in succession over the low end of the output range and then by Σ bands in succession over the high end of the output range. Thus, the high end of one Σ band is made equal to the low end of the next higher Σ band:

FULL OVERLAP - CONDITIONS FOR
CONTINUOUS OUTPUT TUNING $f_1 + F_H/N = f_1 + \theta + F_L/N$ $F_H/N = \theta + F_L/N$ $F_H - F_L = N\theta$ -continued
FULL OVERLAP - CONDITIONS FOR
CONTINUOUS OUTPUT TUNING $$\theta = \frac{F_H - F_L}{N} \quad \text{EQUATION E} = \text{EQUATION C}$$

NOTE:
in the above, the high end of the first Σ band and the low end of the next higher Σ band are made equal.

Figure 4B:
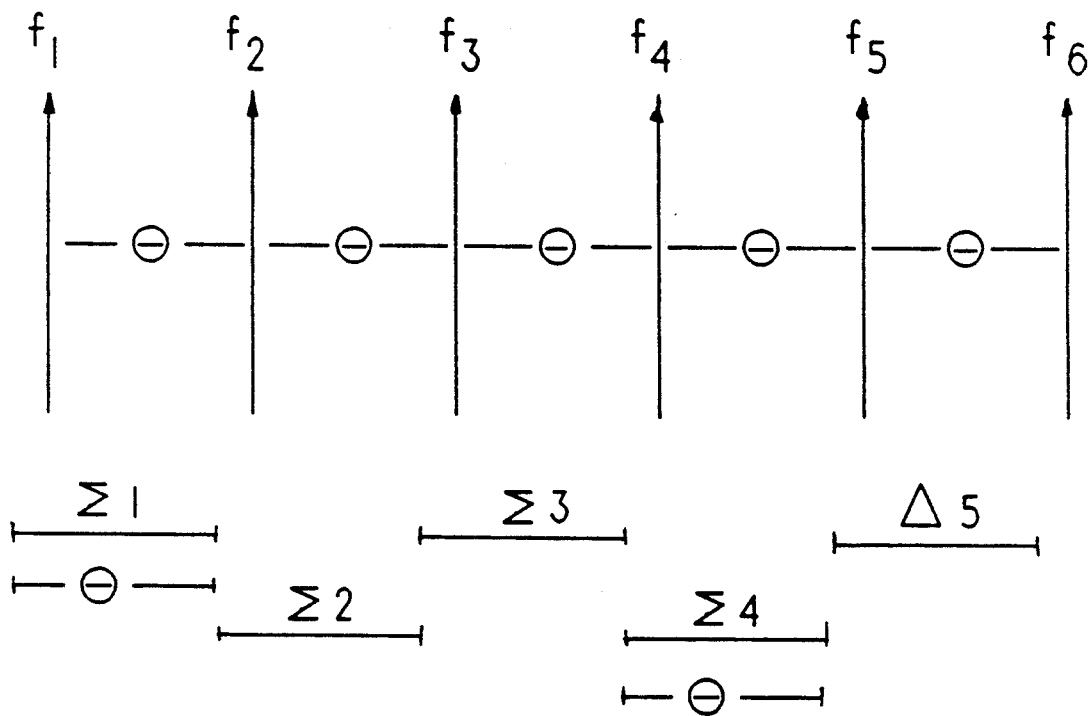

As shown in FIG. 4B, Equation E results in the Σ bands having a width equal to $\theta$ but the bands are not lined up with the LO frequencies. Accordingly, the output frequency coverage is partially continuous and usable, but the stage cannot be cascaded since the input fixed frequency range $F_L$ to $F_H$ will not be repeated at the output of a cascaded stage synthesizer that implements Equation E.

If the Σ and Δ band patterns are forced to touch at some point, as in the half overlap case, the resulting output has full frequency continuity. Again, the highest end of a Σ band is made to touch the lowest edge of a higher or nth Δ band. Thus:

$$f_1 + F_H/N = (f_1 + n\theta) - F_H/N$$

Therefore:

$$F_H = nN\theta/2 \qquad \text{EQUATION A}$$

FULL OVERLAP - CONDITION FOR Σ BAND
TO TOUCH EDGE OF HIGHER Δ BAND $$F_H = nN\theta/2 \qquad \text{EQUATION A}$$

For the full overlap pattern:

$$\theta = \frac{F_H - F_L}{N}$$

$$F_H = F_L + N\theta = nN\theta/2$$

$$F_L = nN\theta/2 - N\theta = N\theta(n/2 - 1)$$

$$F_L = N\theta(n-2)/2 \qquad \text{EQUATION F}$$

The following table is a representative listing of different DF stages that can be designed for various values of n, an integer. The value of the divisor N has a value of 8 for all cases in this example, and the value of the LO frequency spacing $\theta$ is either 40 or 80 for all cases in this example. Clearly, a wide variety of DF stages can be provided in accordance with the invention from narrow to wide output frequency bandwidths. A full octave embodiment, for example, is provided when n=4 with full overlap or when n=2 with half overlap.

TABLE 3

| COMBINATIONS FOR N = 8, and $\theta$ = 40° or $\theta$ = 80° AND VARIABLE n | | | | |
|---|---|---|---|---|
| | $\theta = 40$ | | $\theta = 80$ | |
| n | $F_L$ | $F_H$ | $F_L$ | $F_H$ |
| FULL OVERLAP EQUATIONS | | | | |
| $F_H = nN\theta/2$ | | | EQUATION A | |
| $F_L = N\theta(n-2)/2$ | | | EQUATION F | |
| N = 8 | | | | |
| 2 | | | | |
| 3 | 160 | 480 | 320 | 960 |
| 4 | 320 | 640 | 640 | 1280 |
| 5 | 480 | 800 | 960 | 1600 |
| 6* | 640 | 960 | 1280 | 1920 |
| 7 | 800 | 1120 | 1600 | 2240 |
| HALF OVERLAP EQUATIONS | | | | |
| $F_H = nN\theta/2$ | | | EQUATION A | |
| $F_L = N\theta(n-1)/2$ | | | EQUATION B | |

TABLE 3-continued

COMBINATIONS FOR N = 8, and $\theta = 40°$ or $\theta = 80°$ AND VARIABLE n

| | $\theta = 40$ | | $\theta = 80$ | |
|---|---|---|---|---|
| n | $F_L$ | $F_H$ | $F_L$ | $F_H$ |
| 2 | 160 | 320 | 320 | 640 octave |
| 3 | 320 | 480 | 640 | 960 |
| 4 | 480 | 640 | 960 | 1280 |
| 5 | 640 | 800 | 1280 | 1600 |
| 6 | 800 | 960 | 1600 | 1920 |
| 7 | 960 | 1120 | 1920 | 2240 |

*This case corresponds to prototype subsequently described herein.

CONDITIONS FOR STAGE CASCADABILITY

As already considered in relation to the full overlap case, the basic parameter relationships for a DF synthesizer arranged in accordance with the invention may be structured to permit stage cascading in addition to being structured to establish continuous output frequency coverage. Generally, it is desirable that the characteristic of cascadability be provided for DF synthesizer stages structured in accordance with the present invention.

With reference again to FIG. 1, stage cascadability exists if the input frequencies $F_L$ through $F_H$ appear at the stage output. If the selectable LO frequencies are somewhat arbitrarily related to the fixed input frequencies, the resultant output frequency band is dependent on that arbitrary relationship.

In implementing the present invention to provide stage cascadability, the input fixed frequencies and the selectable LO frequencies are accordingly interrelated so that the output frequency $f_o$ ranges from $F_L$ to $F_H$. The incremental frequency $\theta$ is forced to be harmonically related to the lowest LO frequency $f_1$.

The conditions for cascadability for the full overlap and half overlap cases are thus defined as follows:

CONDITIONS FOR CASCADABILITY FULL
OVERLAP WITH EQUATIONS A and C and F APPLIED $$f_0 = F_L = f_1 \pm p\theta \pm (F_L/N)$$

where: p is an integer
N is the frequency divisor

Therefore $f_1 = F_L \left(1 - \frac{1}{N}\right) \pm p\theta$

But $F_L = \frac{N\theta(n-2)}{2}$ for full overlap

Therefore $f_1 = \frac{N\theta(n-2)}{2} \times \frac{1}{N}[N-1] \pm p\theta$ $f_1 = N\theta \frac{(n-2)}{2} \times \frac{N-1}{N} \pm p\theta$ $f_1 = \theta \frac{[(n-2)(N-1) \pm p]}{2}$    EQUATION G NOTE:
To be cascadable, $F_L$ through $F_H$ should appear at the synthesizer stage output.

CONDITIONS FOR CASCADABILITY HALF
OVERLAP WITH EQUATIONS A AND B APPLIED $$f_0 = F_L = f_1 \pm r\theta/2 \pm (F_L/N)$$

where: r is an integer
N is the frequency divisor

-continued $f_1 = F_L \pm r\theta/2 \pm (F_L/N) = F_L(N-1)/N \pm r\theta/2$ $f_1 = N\theta(n-1)/2 \times (N-1)/N \pm r\theta/2$ $f_1 = \theta \frac{[(n-1)(N-1) \pm r]}{2}$    EQUATION H As a particular application example, a cascadable full octave DF synthesizer is provided in the half overlap design if n=2 and r=1.

BEATING THE BIRDS

As previously indicated, DF synthesizers can be readily structured in accordance with the present invention to provide high radar performance that enables detection of relatively low cross-section targets. One of the major reasons for this high performance is that spurious or spur signals or birds are totally avoided or so limited in amplitude as to be non-interfering with detection of low cross-section targets.

Most bird signals originate as fixed frequency harmonics generated by synthesizer mixer circuitry. It has been known that the amplitude of mixer output spurs is affected by the amplitude of input frequency signals at the mixer I and L ports and by the ratio a/b of the I and L input signal frequencies. Thus, conventional mixer charts predict mixer performance as a function of the ratio a/b.

Some bird signals also arise as fixed frequency signals that "leak through" the synthesizer divider from the fixed frequency source. Similarly, bird signals may arise as selectable frequency signals that leak from the selectable frequency source. To prevent such leak through signals from entering the mixer circuitry and degrading the synthesizer output, filter rejection action is applied against the outputs from the frequency divider and the selectable frequency source.

When the divisor N equals or is greater than 4, spur output signals become higher in order and lower in amplitude as the ratio a/b decreases, under the assumption that the synthesizer output frequency band excludes both mixer input frequencies. As a result, it has been conventional practice to substantially reduce harmonic spurs by using a relatively high ratio a/b. However, 1×2 spur products, i.e. the sum or difference produced by beating a LO signal against a spurious second harmonic of an input (I) fixed frequency signal, have typically persisted as very troublesome spur signals to "beat".

With reference again to the invention embodiment shown in FIG. 1, for a given selectable frequency such as $f_1$ applied to the L (b) port, the mixer sum output goes from ($f_1+f_L/N$) to ($f_1+F_H/N$) and the 1×2 spur output goes from ($f_1+2F_L/N$) to ($f_1+2 2F_H/N$). Accordingly, the frequency spacing between the high end of the desired frequency band and the low end of the 1×2 band is:

$(f_1+2 F_L/N)-(f_1+F_H/N)=1/N (2F_L F_H)$

To maximize the maximum frequency between the desired output frequency band and the undesired 1×2 spur band, $F_L$ is relatively maximized and $F_H$ is relatively minimized in DF synthesizers structured in accordance with the invention. Accordingly, to beat the 1×2 spurs, the fixed input frequency band is preferably chosen so that the band pass filter 24 is provided with a high center frequency and so that $F_H$ is less than $2F_L$ such that the second harmonic of $f_L$ does not fall within the pass band of the filter 24. This result is achieved by choosing high values for n in both the half and full overlap cases.

Generally, for a given N, better bird performance is achieved with higher values of n. However, a tradeoff occurs as n is increased, i.e. more LO frequencies are required to meet synthesizer output frequency requirements. Therefore, these cross-effects are appropriately balanced in choosing the value of n for a particular synthesizer design.

Another aspect of the invention involves choosing particular mixer characteristics in accordance with the harmonic signals content of the applicable mixer chart. Thus, the present invention generally provides better spur performance by "pushing" harmonic spurs higher in order and thereby lower in amplitude. Inspection of the mixer chart applicable to the frequency plan for a DF synthesizer, structured in accordance with the invention, may suggest additional improvement that may be realized in spur performance.

For example, the mixer chart may show that the pattern of low amplitude, higher order spurs includes a number of spur signals of a single higher harmonic order over the operating range of the synthesizer. Selection of a mixer having a rejection characteristic for that particular harmonic accordingly provides even better performance.

In the optimum full overlap embodiment shown in FIG. 11E and subsequently described herein, the sixth harmonic is relatively frequently generated as in conventional mixer chart. Thus, use of a mixer with a high rejection characteristic for the sixth harmonic enhances the spur performance of the FIG. 11E embodiment even further. In particular, if the 6I harmonics are nulled out, the synthesizer is capable of −100 dbc spur performance.

Generally, it is also noteworthy that the fixed frequency signals $F_L$ through $F_H$ applied to the input of the synthesizer divider need not be as spur free as the selectable LO frequencies. Thus, a spur input to the synthesizer divider at an offset of $f_m$ from the desired input frequency fin appears at the output of the frequency divider at an offset of $f_m$ from the desired output frequency of $f_{in}/N$.

Such a spur input is attenuated by (20 log N)db if the input spur is approximately 20 db below the desired input $f_{in}$. Small signal FM theory applies in this process and AM modulation is eliminated by the amplitude limiting action of the frequency divider. The FM carrier to sideband ratio is defined by; (20 log$\Delta F/2f_m$) where $\Delta F$ is the frequency deviation. In passing through the frequency divider, the frequency deviation $\Delta F$ is reduced by N and $f_m$ remains constant.

At the DF synthesizer output, maximum bandwidth BW is obtained by maximizing $F_H - F_L$. The number of output filters required to tune a given band is then relatively minimized as subsequently considered more fully herein. However, to beat the $1 \times 2$ birds as previously considered, $F_H$ is kept less than $2F_L$ so that the second harmonic of $F_L$ does not fall in the pass band of the divider filter means. Within $F_H$ and $F_L$ value limits needed to beat the $1 \times 2$ birds, making the selectable LO frequency spacing $\theta$ larger increases the output filter bandwidth.

BEATING PHASE NOISE (THE GRASS)

A large part of synthesizer phase noise emanates from the frequency divider. Other noise sources include amplifiers in the synthesizer circuitry. In addition, the synthesizer master oscillator generates phase noise that is frequency multiplied.

Phase noise is held exceptionally low in DF synthesizers made in accordance with the present invention. Thus, apart from the conventional practice of choosing circuit components that have low phase noise characteristics, signal levels are kept relatively high throughout the synthesizer circuitry of the present invention and particularly in the mixer circuitry. High signal levels are enabled by the fact that only higher order and lower amplitude inband spurs are present as a result of the operation of the invention as previously described. With high operating signal levels, phase noise is held exceptionally low because of the high signal to noise ratio.

FILTER SIMPLIFICATION

Output filter simplification in DF synthesizer design and manufacture is important because it leads to reduced manufacturing costs, reduced product size and better operating reliability. The present invention has added advantage in the sense that it provides highly improved synthesizer operating performance and simultaneously permits simplification of the synthesizer output filter bank.

Generally, the output filters need to be selected so that in aggregate any selected output frequency in the output frequency bandwidth is passed while any spurs that may be simultaneously generated with the selected output frequency signal are rejected. The signal pass and reject requirements cause increased filter bank complexity as the number and frequency location of spurs become more problematical.

In accordance with the present invention, filter bank simplification results from reduced presence of spur signals at the synthesizer output, greater distancing of spurs from desired output signals, and reduced spur amplitudes. As a result of the better spur patterns made possible in various synthesizer designs in accordance with the present invention, filter multiplexing and resultant filter simplification are enabled or facilitated. Thus, frequency output signal pass/reject requirements that may conventionally necessitate two or three different filters may require only one filter when the synthesizer is made in accordance with the present invention. The exact nature of filter multiplexing is determined by the frequency pattern chosen, the frequency location of spurs relative to chosen output frequencies, and the synthesizer requirements.

Filter shape factor is an important variable in determining both the overall synthesizer performance and the extent to which filter simplification may be possible in a synthesizer made in accordance with the invention. It is defined as follows:

$$Y = \frac{\text{(frequency to be rejected)} - \text{(filter center frequency)}}{\text{filter 3db bandwidth}}$$

Filter simplification increases with increasing values of Y, and Y increases as n increases. As a general rule, therefore, filters become easier to realize and combine as n increases.

Figure 5:
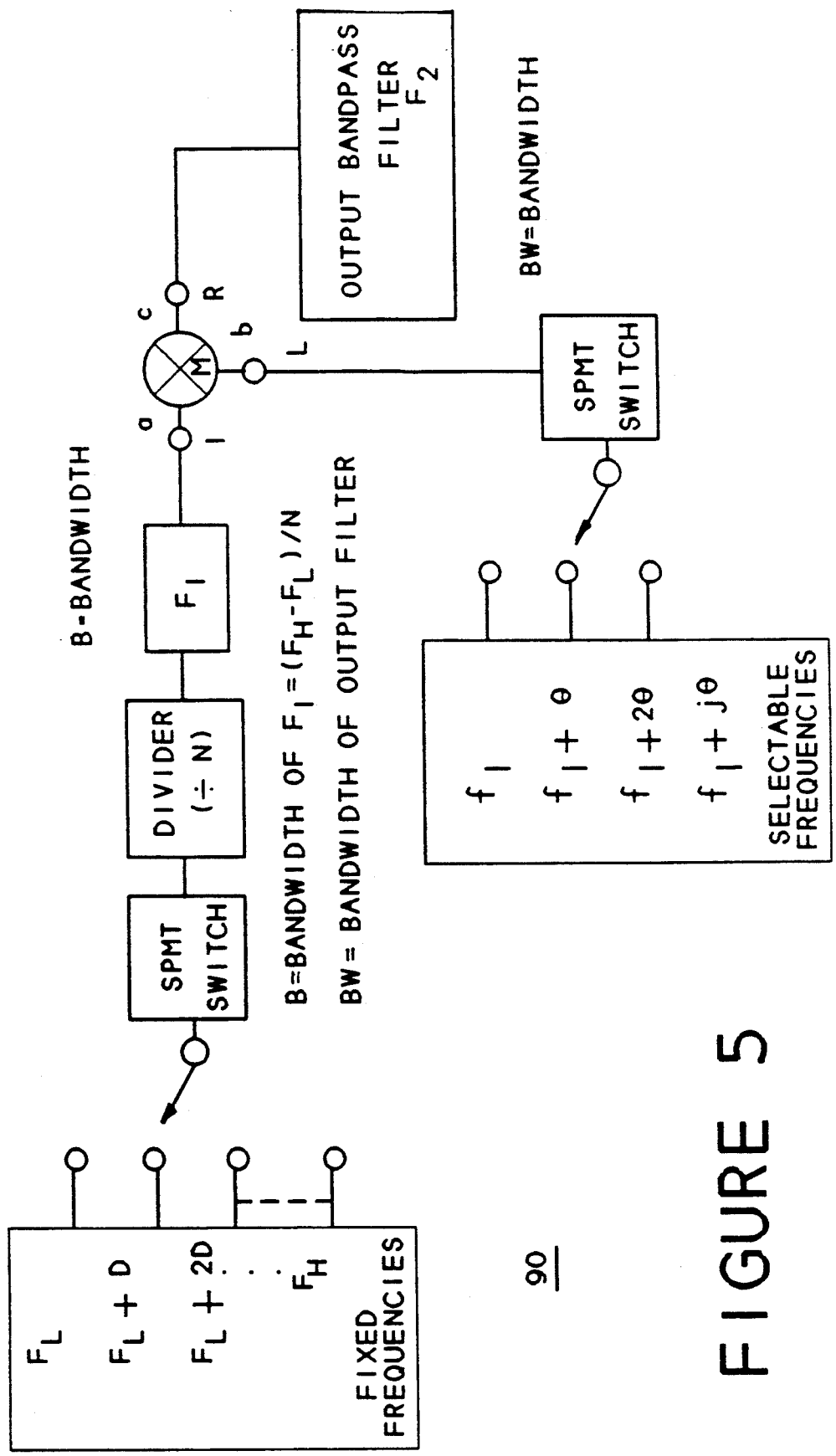
FIG. 5 shows a synthesizer stage like the synthesizer of FIG. 1 with references that are used in developing filter shape equations for use in structuring direct frequency synthesizers in accordance with the invention.
Figure 6A:
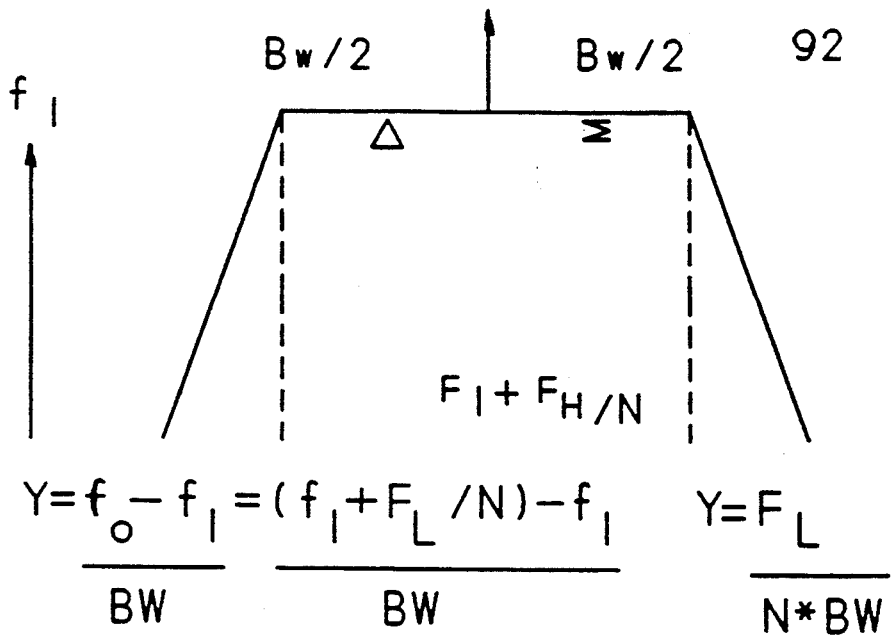
FIGS. 6A and 6B show graphs that illustrate variables used in the filter shape equations respectively for the half and full overlap cases.

In FIG. 5, there is shown a schematic diagram of a basic DF synthesizer stage 90 structured like the embodiment of FIG. 1 in accordance with the invention. The synthesizer 90 is labeled with identifiers used in developing filter shape factor equations for the half and full overlap cases. For the half overlap case, reference is made to filter characteristic 92 shown in FIG. 6A:

HALF OVERLAP FILTER SHAPE FACTOR $B$ = bandwidth of $F_1$ = $(F_H - F_L)/N$ $BW$ = bandwidth of output filter $F2$ $$Y = \frac{F_L}{2N(BW)}$$

Figure 6B:
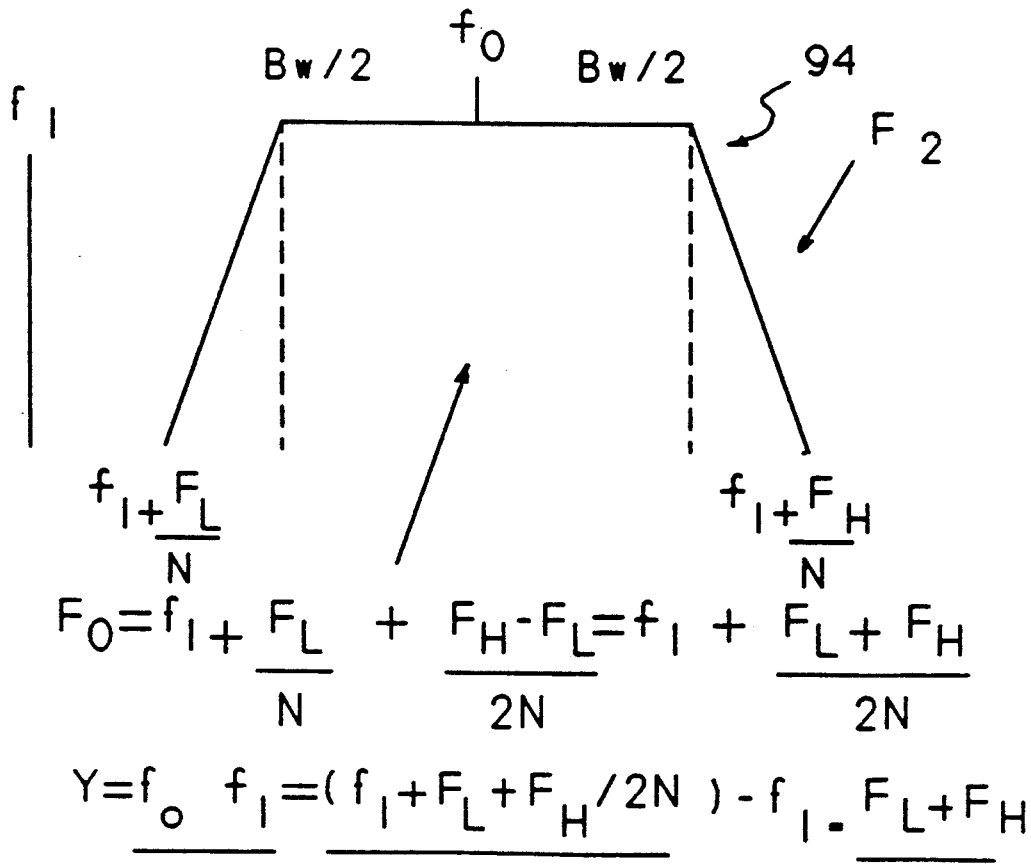

For the full overlap case, reference is made to filter characteristic 94 shown in FIG. 6B:

FULL OVERLAP FILTER SHAPE FACTOR $$Y = \frac{(F_L + F_H)}{2N(BW)}$$

In both the half and full overlap cases, $F_L$ is chosen high and filter bandwidth BW is chosen low to simplify filtering. This strategy results from the fact that the frequency divisor N needs to be high for low spurs and $\theta$ needs to be high for maximum frequency coverage for each switched filter.

MULTIPLICATION OF OUTPUT BANDWIDTH WITHOUT INCREASING PHASE NOISE, SPUR LEVELS AND FREQUENCY STEP SIZE

Multiplication facilitates providing X or other higher level output frequency bandwidths from a synthesizer stage having a lower level output frequency bandwidth. For example, it may be desirable to provide a full octave synthesizer having a output bandwidth of 5 GHz to 10 GHz from a full octave synthesizer stage having an output bandwidth of 500 MHz to 1000 MHz.

If the conventional technique of connecting a ten times multiplier directly at the output of the frequency synthesizer stage, the worst of the unwanted signals are excessively degraded. Specifically, frequency divider noise and in-band mixing products are each typically increased by 20 db. Further, incremental output frequency spacing is increased by a factor of ten. Such results are entirely unacceptable for high performance radar systems which may require in-band spurs to be −80 dbc and carrier to noise floor levels to be about −150 dbc/Hz.

Figure 7:
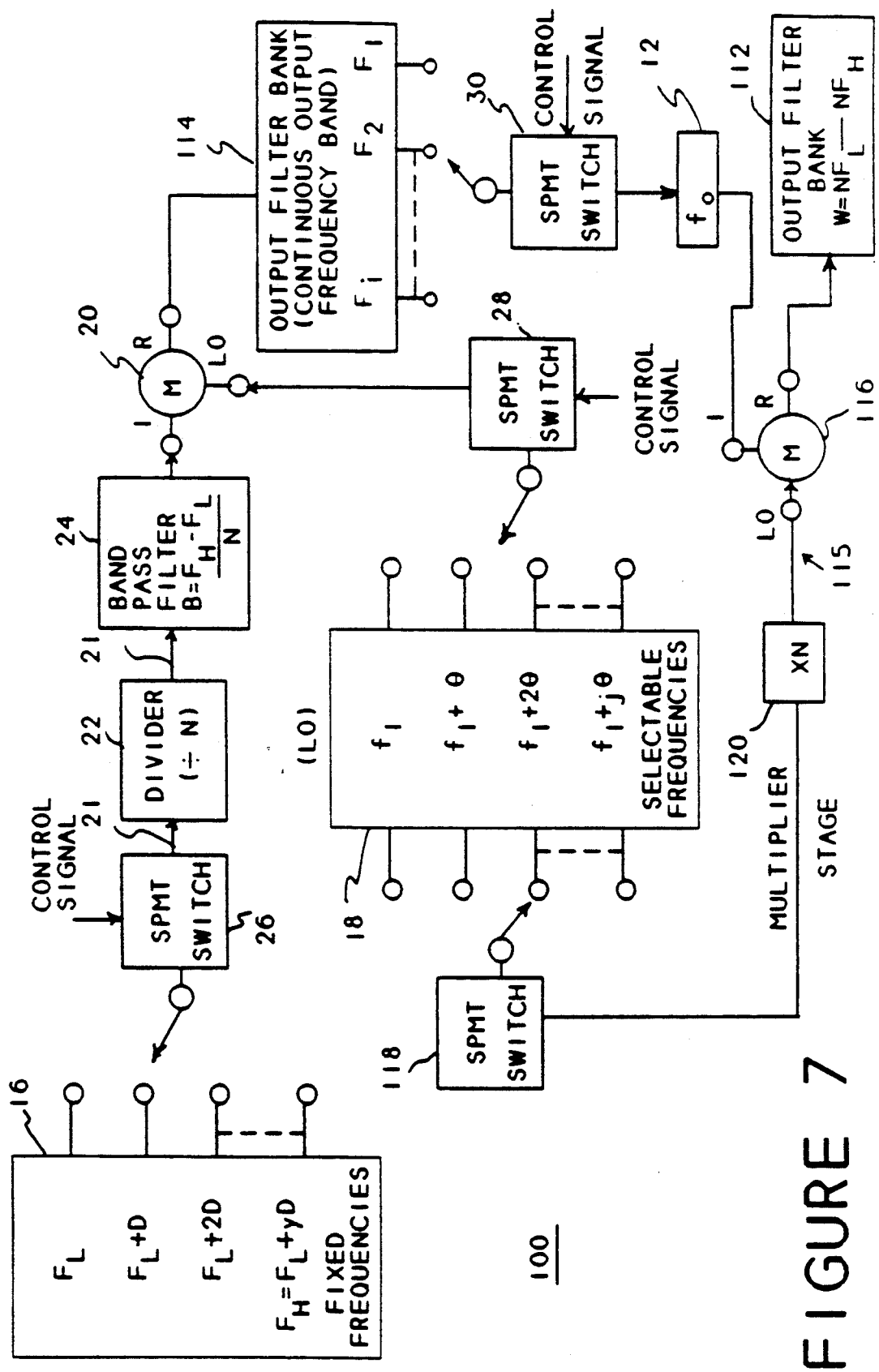
FIG. 7 shows another embodiment of a direct frequency synthesizer in which output frequency bandwidth multiplication is improved in accordance with the invention.

As shown in another embodiment of the invention in FIG. 7, a synthesizer 100 includes a first stage 102 like the embodiment shown in FIG. 1. It includes first stage components identical to those shown for the synthesizer 10 in FIG. 1.

To achieve significantly improved bandwidth multiplication in accordance with the present invention, output frequency signals from the filter bank 114 are applied to a multiplication stage 115, i.e. the signals are applied without division to a mixer 116 at its I port. Each selectable frequency from the source 118 is coupled through a SPMT switch to a multiplier 120 which has a multiplication factor of N. The multiplier output is coupled to the mixer L port and beat against the I input.

The multiplier mixer output is coupled to an output filter bank 112 where the output frequency band is equal to ten times the frequency band from the filter bank 114. In fact, the entire pattern of mixer products and output filter values is scaled upward by a factor of ten because the selectable frequencies are multiplied by N while the fixed frequency inputs from the filter bank 114 are passed directly to the mixer 116 without being divided by N.

Since the multiplier 120 is outside the forward path in which the flow of divider noise and mixer birds pass, no degradation occurs in these otherwise troublesome and unwanted signals. Moreover, no increase occurs in the size of the output frequency step size because the number of output frequency signals has also been scaled upward by a factor of N as previously suggested.

RETENTION OF PHASE MEMORY DURING FREQUENCY SIGNAL SWITCHING OPERATIONS

When the synthesizer output frequency is switched in conventional synthesizers, the switching may occur at any of various points in time in the frequency signal waveform. When the conventional synthesizer is switched to regenerate the original frequency signal, the waveform resumption will likely occur at a point different from the point at which it had been previously interrupted. Phase memory is absent in this process because of the multiple phase states that are possible with conventional ripple frequency dividers.

Some synthesizer applications require phase memory which is defined to occur when a synthesizer switches from a first frequency signal to a second frequency signal and back to the first frequency signal with the phase of the first frequency signal appearing to have been continuous. Synthesizers may be structured in accordance with the present invention to achieve phase memory.

Figure 8:
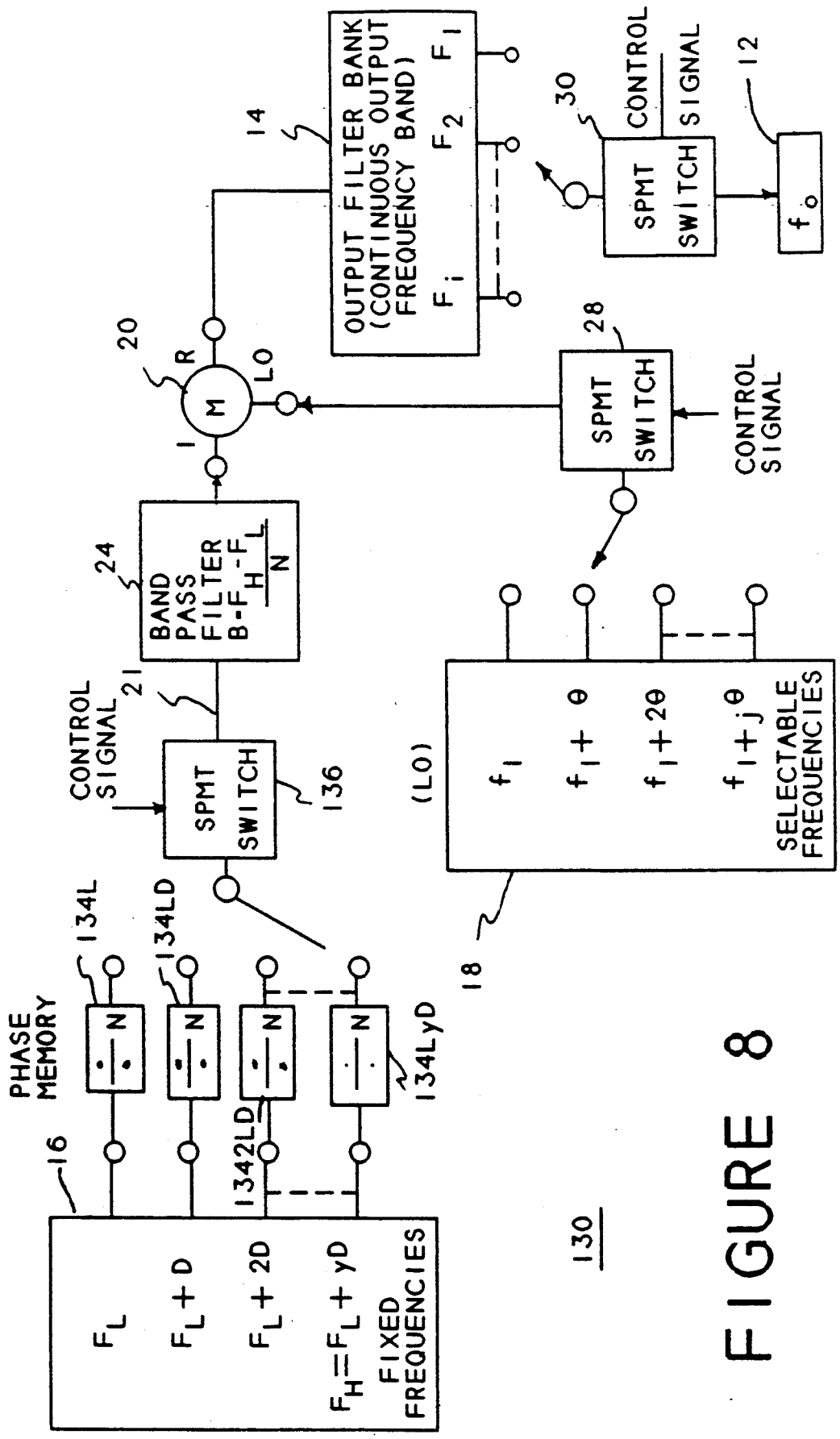
FIG. 8 shows an additional embodiment of a direct frequency synthesizer in which phase memory is provided for input fixed frequency signals in accordance with the invention.

Reference is made to FIG. 8 where there is shown another embodiment of the invention in which a synthesizer 130 is structured to provide phase memory. The synthesizer 130 is like the synthesizer 10 of FIG. 1 and accordingly like parts are identified by identical reference characters.

Individual divider means 134L through 134LyD are provided for the individual fixed or starter frequencies and a single pole multiple throw switch 136 is connected under logic control to one of the divider means to pass the particular fixed frequency signal needed for the currently selected synthesizer output signal. The output from the switch 136 is connected to the band pass filter 24 described in connection with FIG. 1.

As frequency switching operations occur, all of the divider means continue to toggle thereby generating respective continuous waveforms. Therefore, any time that a synthesizer switching operation causes the switch 136 to be disconnected from and then subsequently reconnected to a particular divider means, the frequency signal from that divider means will appear to have been continuous because it will in fact have been continuous. Phase memory is accordingly provided.

If phase memory for the LO frequency is also problematic in a particular synthesizer design, the individual divider means can be structured in multiple divisional layers so that properly valued frequency signals continuously available at an intermediate division level can be used for the selectable LO frequency inputs with phase memory. Additional explanation is provided on this aspect of phase memory in subsequent description herein directed to a full octave embodiment of the invention.

FULL OCTAVE SYNTHESIZER EMBODIMENT

Figure 9A:
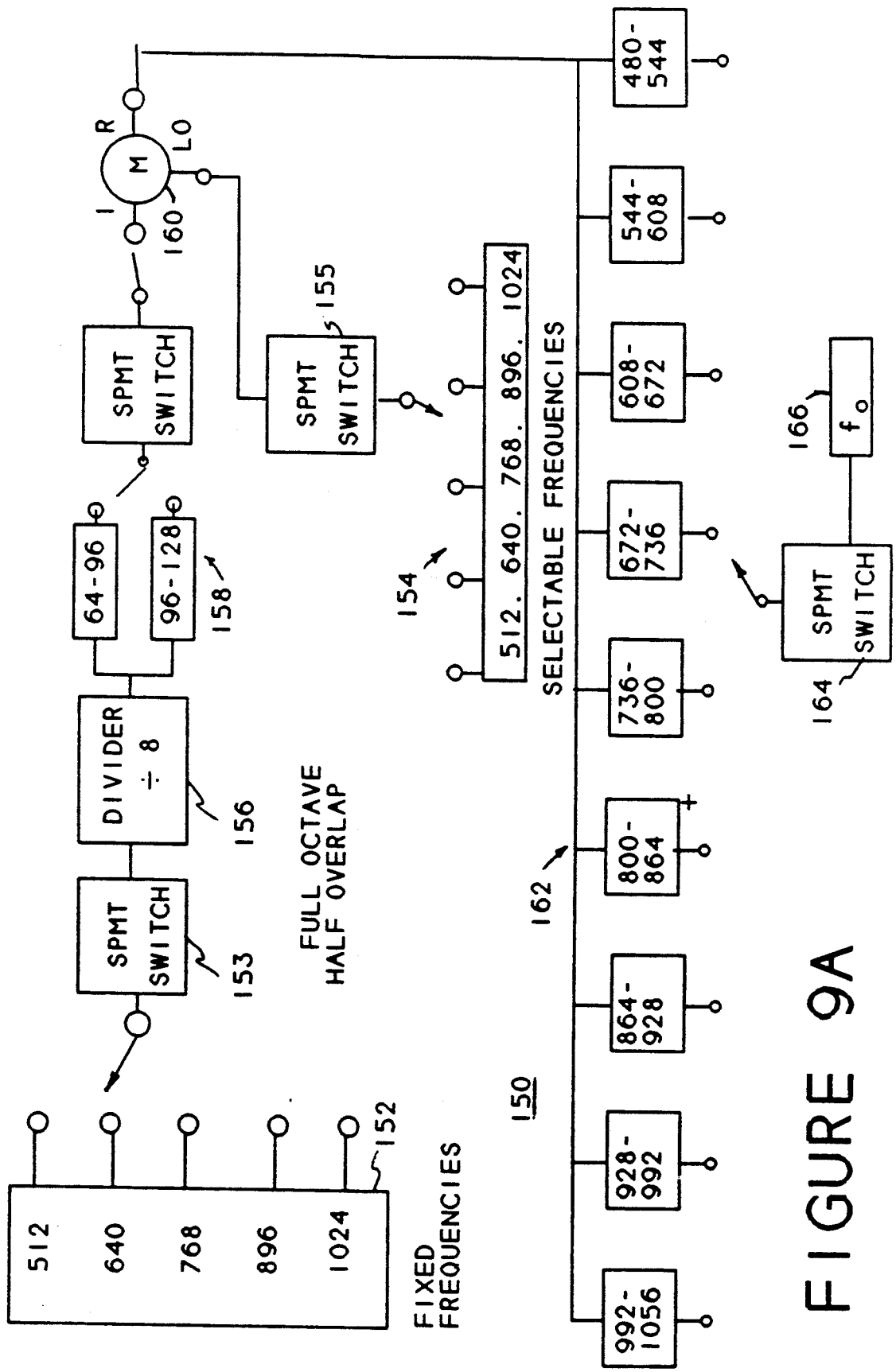
FIG. 9A shows a block diagram for a full octave direct frequency synthesizer embodied in accordance with the invention.

In FIG. 9A, there is shown a more detailed embodiment of the invention that is specially structured to provide a full octave output frequency bandwidth. An octave is defined as a band of frequencies for which the highest frequency is twice the lowest frequency.

Thus, a full octave half overlap DF synthesizer 150 includes fixed and selectable LO frequency sources 152 and 154 with each supplying the same five frequency signals shown over the frequency band 512 MHz to 1024 MHz. The fixed frequency signal spacings $\theta$ and D are both equal to 128 MHz.

The divisor N provided by a divider 156 equals 8 although in other caess it can have other even values. A band pass filter 158 in this case is formed by two parallel filters each of which covers half of the 64 MHz bandwidth. A single pole, double throw switch connects one of the two filters in the forward synthesizer circuit path according to the selected output frequency.

Single pole, multiple throw (SPMT) switches 153 and 155 connect the required fixed and LO frequency signals to the I and L ports of a mixer 160 to generate the selected output frequency signal. An output filter block 162 is provided with nine filters which are connected through a SPMT switch 164 to supply the selected output frequency signal from block 166.

Figure 9B:
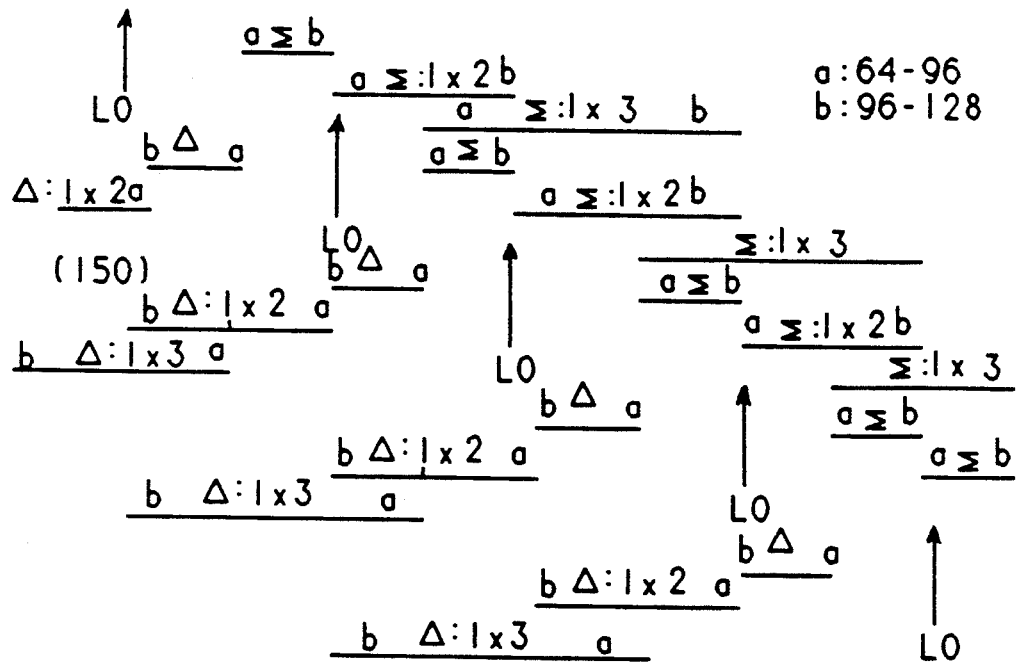
FIG. 9B is a graph that illustrates a frequency pattern that applies to the synthesizer of FIG. 9A.

FIG. 9B shows the band pass characteristic of each of the filters in the filter block 162 and the frequency location of the sum and difference bands for the desired and the 1×2 mixer products, higher harmonic mixer products, and leak-through LO signals.

The synthesizer 150 is a single stage unit that has (N+1) or nine output filters. While a relatively low filter shape factor (Y=1) makes filter realization more difficult, other invention advantages more than offset this difficulty.

If smaller output frequency step sizes are desired, additional stages like the stage shown are interconnected as described in connection with FIG. 2. In that case, each intermediate stage has output filters that can, with significant economy, be multiplexed into a single pole three throw switch. This particular filter simplification is achieved by the present invention for full octave synthesizers and is considered again in connection with FIG. 10.

A full octave synthesizer designed in accordance with the invention is additionally advantageous in that an octave bandwidth is achieved with a relative minimum of fixed frequencies. The number of fixed frequencies is N/2+1, i.e. 5 in the case of FIG. 9A. It is also noteworthy that the half overlap variable integer r is one and the integer n equals two for the case of FIG. 9A. Generally, the integer n must have a value of 2 for the half overlap full octave version of the invention.

Figure 8A:
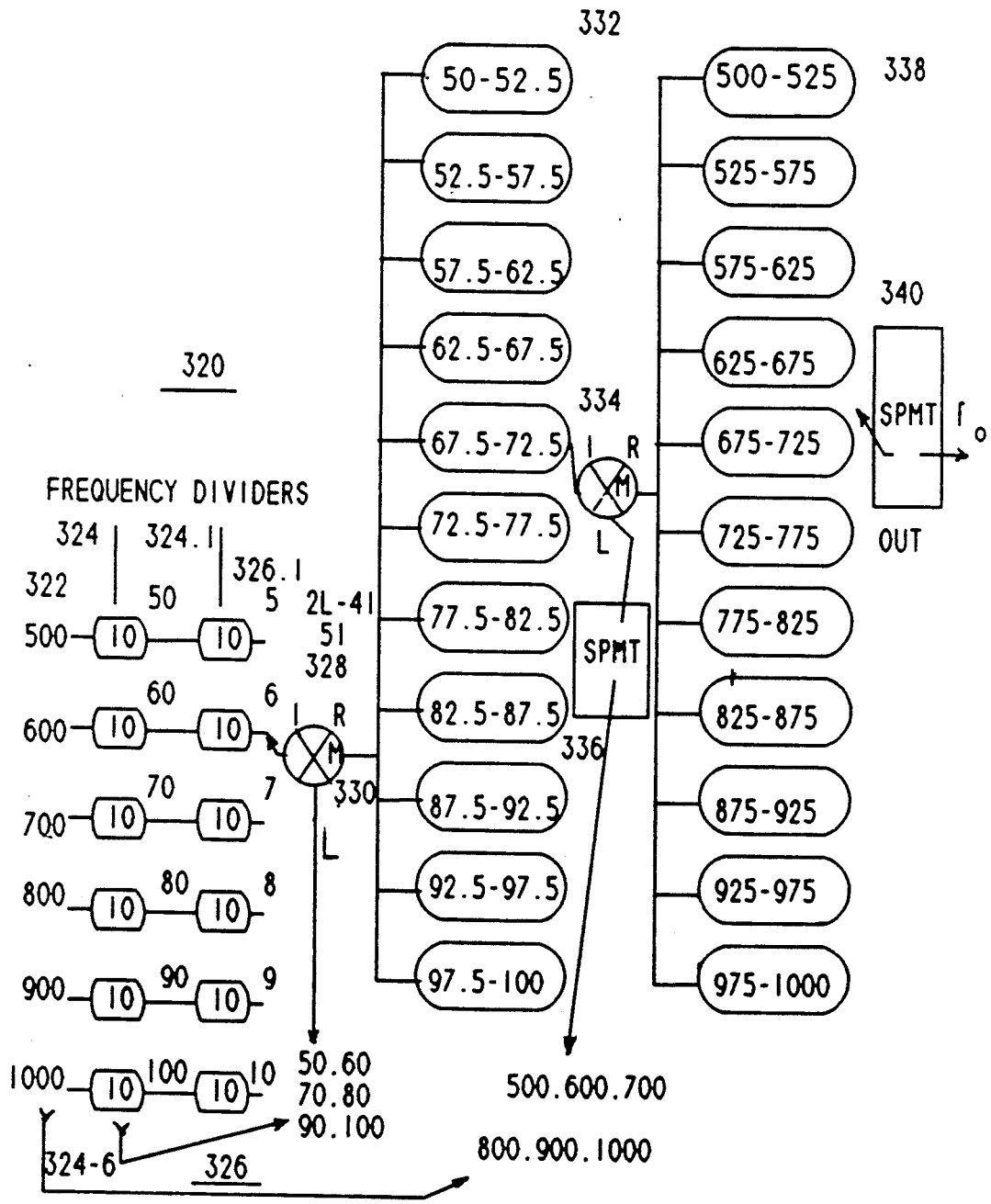
FIG. 8A shows a two-stage full octave frequency synthesizer provided with phase memory in accordance with the invention.

As shown in FIG. 8A, a two-stage full octave frequency synthesizer 320 includes a set of fixed frequencies 322 that are applied to a first tier 324 of respective dividers 324-1 through 324-6 having a divisor equal to 10. The output frequencies from the first divider tier 324 are applied to respective dividers 326-1 through 326-6 and a second divided by ten 326. The output signal from the second divider tier are applied through a SPMT switch 328 to the I port of a first stage mixer 330. The output signals from the second divider tier 324-6 are applied as LO frequency signals to the L port of the first stage mixer 330. The output of the mixer 330 is coupled through an intermediate filter bank 332 to the I port of a second stage mixer 334. The original fixed frequencies 322 are applied through another SPMT switch 336 to the L port of the second stage mixer 334. The second stage mixer output is applied to an output filter bank 338 and a SPMT switch 340 is connected to the filter bank 338 so that the selected output frequency $f_o$ is generated at the output. Output frequency changes occur with phase memory for reasons previously described.

Figure 10A:
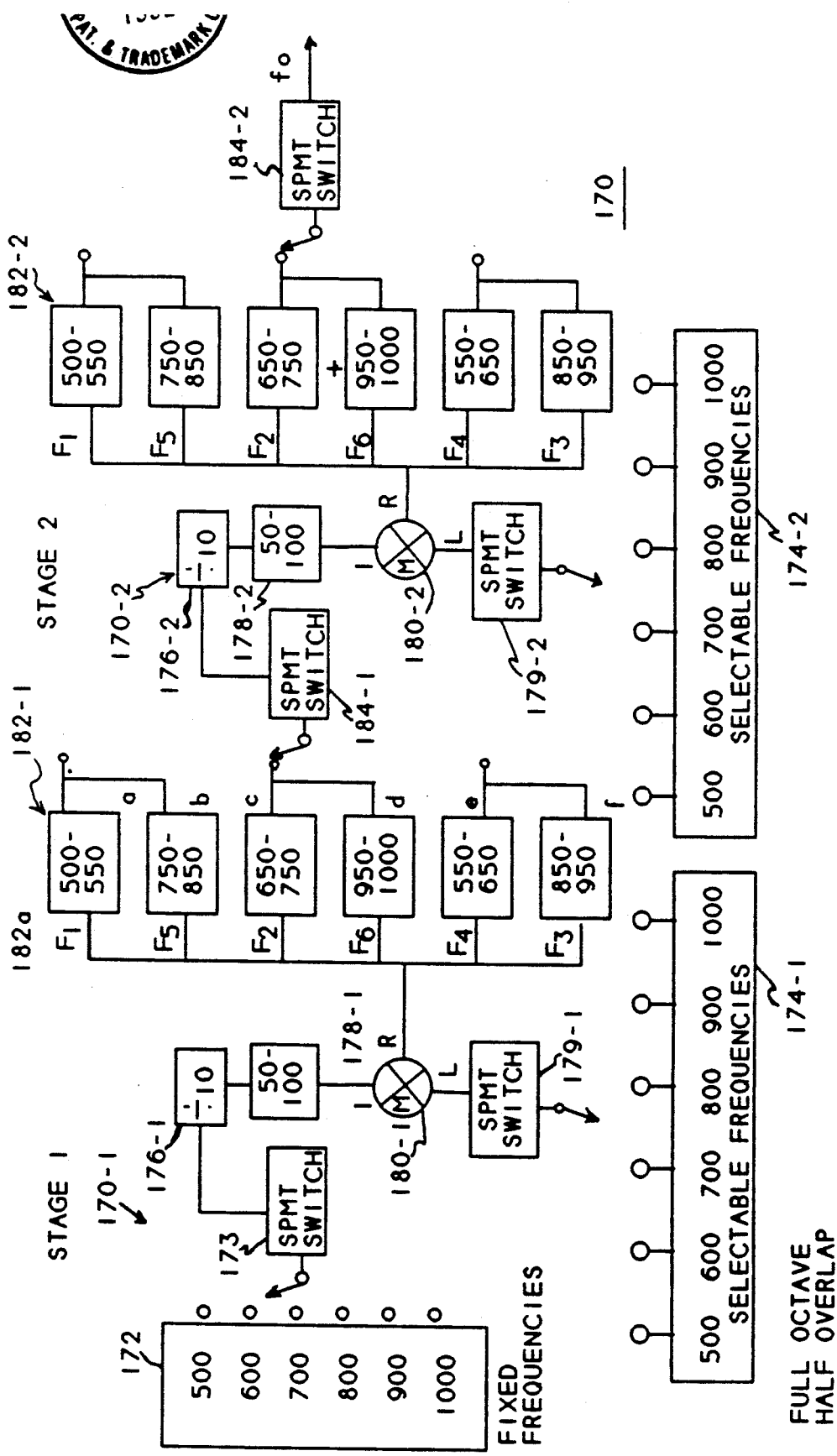
FIG. 10A show the first two stages of a cascaded, multistage, full octave synthesizer embodied in accordance with the invention.
Figure 10B:
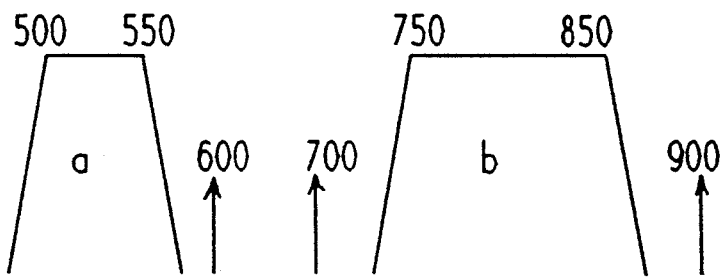
FIG. 10B illustrates filter simplification through the multiplexing of filters in the synthesizer of FIG. 10A.
Figure 10B:
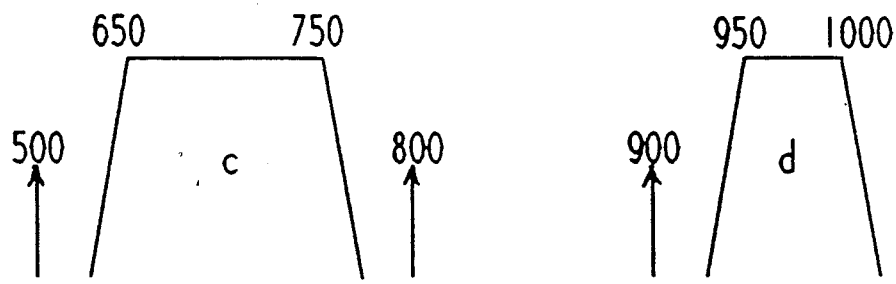
Figure 10B:
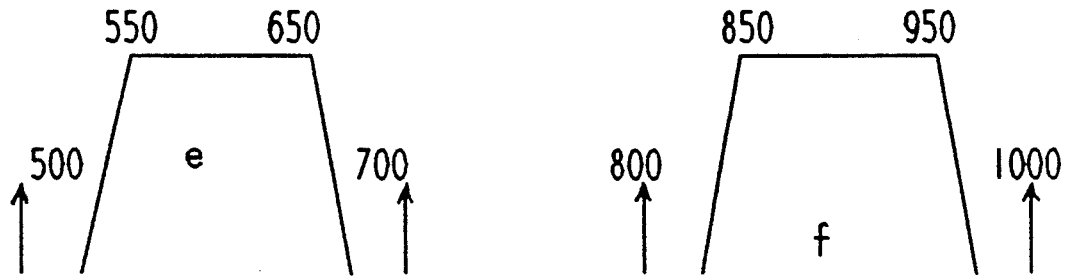
Figure 10C:
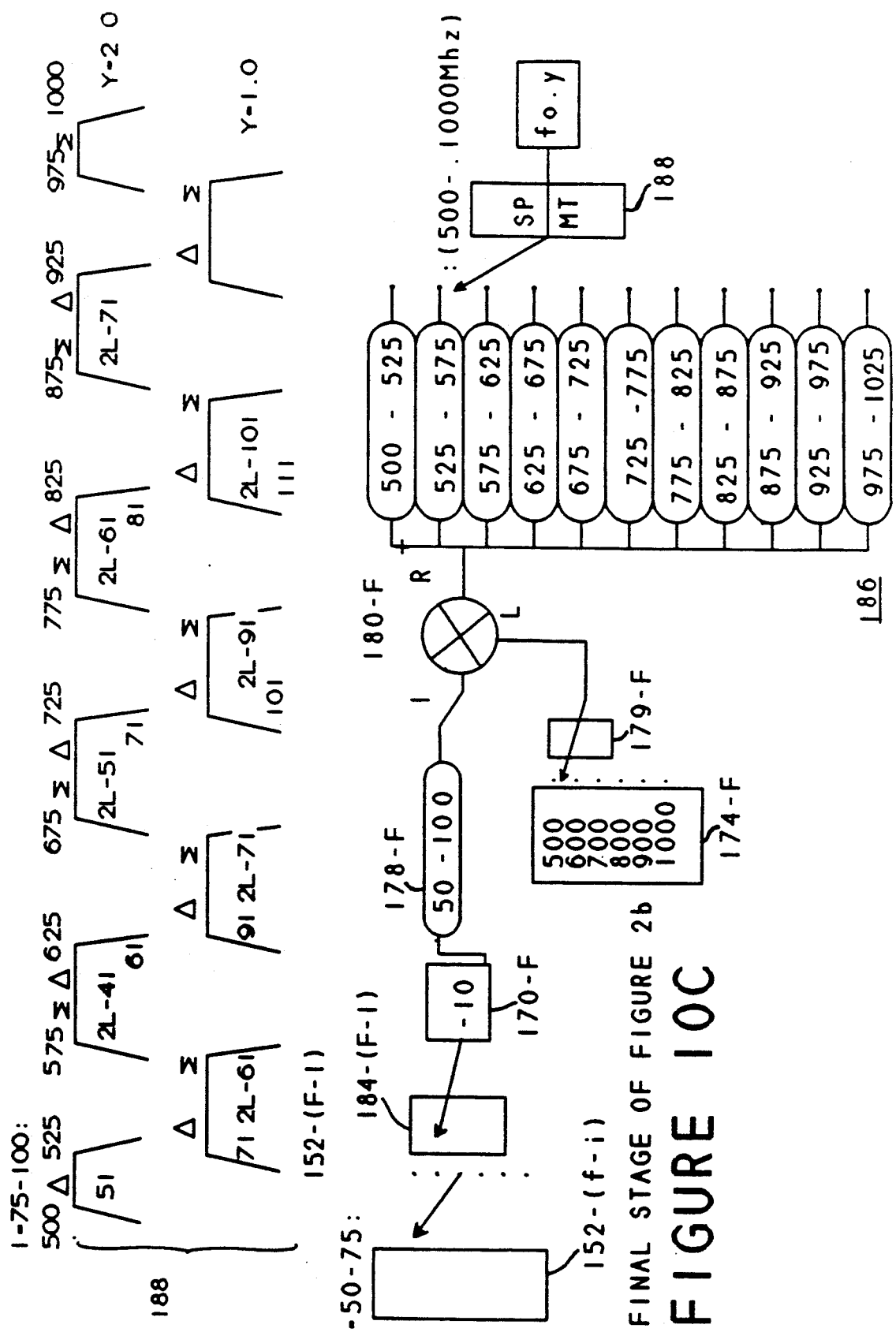
FIG. 10C shows a block diagram for the final stage of the full octave synthesizer of FIG. 10A.
Figure 10D:
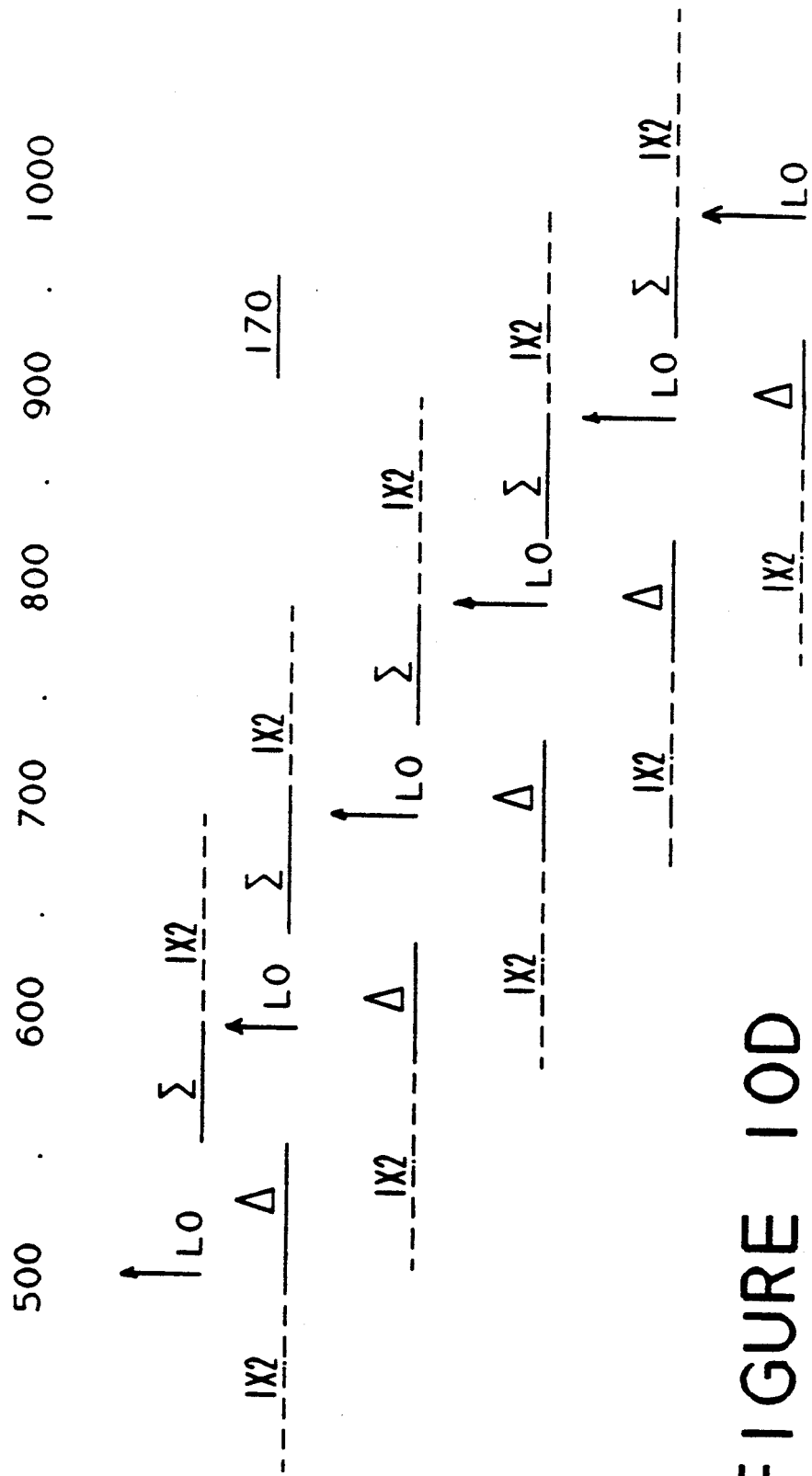
FIG. 10D graphically illustrates the frequency pattern that applies to the synthesizer of FIG. 10A.

Another half overlap full octave synthesizer embodiment of the invention is shown in FIGS. 10A-10D. Thus, a first stage 170-1 and a second stage 170-2 of a cascaded multi-stage DF synthesizer 170 are shown in FIG. 10A. A final stage 170-F of the synthesizer 170 is shown in FIG. 10C.

In this embodiment, fixed and selectable frequency sources generate the same fixed frequencies from 500 MHz to 1000 MHz to provide an output frequency bandwidth over the same frequency range. A divider 176 employs an even divisor N equal to 10. Accordingly, the synthesizer 170 is directly comparable to the synthesizer disclosed in the previously referenced 786 patent since both have the same output frequency bandwidth.

In the synthesizer 170, a single band pass filter 178 is employed. A SPMT switch 173 connects the required fixed frequency signal and a SPMT 179 connects the required LO signal to a mixer 180 in each synthesizer stage in accordance with the selected output frequency.

The mixer output in turn is connected to an intermediate stage output filter bank 182. As previously indicated, intermediate stage filters 182a through 182f can be multiplexed to a single pole, three throw switch 184. FIG. 10B illustrates in greater detail the basis upon which multiplexing to a three position switch is done.

In this special full octave case where the divider input and LO input frequencies are forced to be the same:

$$F_L = f_1 = \frac{\theta N}{2} \quad \text{(EVEN VALUES FOR N)} \quad \text{EQUATION J}$$

N/2 + 1 = number of fixed frequencies

When a full octave DF synthesizer implements EQUATION J, the output filters for all intermediate stages can be multiplexed to a SP3T switch as described for the specific full octave embodiments herein. The final synthesizer stage rejects the (L±2I) mixer products by 20 log N and additional filters are used in the final stage the (L±2I) mixer products.

The final stage 174-F of the synthesizer 170 is shown in FIG. 10C. The output frequency signals from the next previous stage (F-1) (generally) and the LO frequency signals from selectable frequency source 186 are coupled to mixer 180-F and the mixer products are applied to a final output filter bank 186. In this case, the number of output filters is N+1. A SPMT output switch 188 provides the selected output frequency signal over the bandwidth 500 MHz to 1000 MHz.

As in the case of FIG. 9B, FIG. 10C illustrates the output filter characteristics and the frequency location of mixer products and LO leak-through signals for the synthesizer 170. These FIGS. thus show how undesired signals are rejected from the synthesizer output.

Overall, six fixed frequencies are used in the full octave synthesizer 170 to excite the first divide-by-ten frequency divider and to excite the mixer L port of all cascaded stages. Again, the value of n is two. A single mixer is all that is required for each cascaded stage. The 1×2 mixer products are typically −55 dbc below the desired outputs in the intermediate stages and they are thus permitted to pass to be suppressed an additional 20 dB in the final synthesizer stage 170-F.

The first stage provides frequency steps of 10 MHz across the octave frequency band. The second stage provides steps of 1.0 MHz, and each subsequent stage further divides the step size by 10.

Maximum use is made of the six fixed frequencies to generate the octave band output. Both sum and difference frequencies from the single output mixer are used to achieve the output tuning range. Filter in-band mixing products are higher order and lower level from known prior art full octave DF synthesizers. Further, output filtering has a filter shape factor no less than 1 and is at least as simple as if not further simplified over known prior art DF synthesizers.

In the final output stage 170-F, spur products from the prior driver stages are reduced by 20 log 10=20 db at the input to the final mixer 180-F. As shown in FIG. 10C, the worst in-band mixing product for the difference side band when LO=600 MHz is a fifth harmonic at the edge of the pass band. For the sum band, the worst in-band mixing product is a 2×4 at the edge of the pass band when LO=500 MHz. Prior art DF synthesizers typically have in-band content of third harmonics which degrade output performance.

Finally, the synthesizer 170 is characterized with substantial economy of component usage. For example, only one mixer and thirteen filters are used in the final synthesizer stage, yet high spur performance is achieved.

As already indicated, full octave embodiments of the invention have an even value for N and can employ either the half or full overlap frequency pattern. The preferred value for N is 8, 10 or 16 especially since these values are readily available in hardware.

OPTIMUM FULL OVERLAP SYNTHESIZER EMBODIMENT

An optimum full overlap pattern is embodied in another special version of a cascadable synthesizer in accordance with the present invention such that the input frequency range $F_L$ to $F_H$ is reproduced and maximum output frequency tuning is accomplished with the number of LO frequency signals equal to (N/2 +1).

In accordance with the definition of full overlap, $F_H - F_L = N\theta$. Therefore, a minimum output frequency spread of $N\theta$ must be achieved at the output to allow the synthesizer to be cascadable.

The features of the optimum full overlap case are illustrated by comparing the output filter and frequency patterns for several different invention embodiments shown in FIGS. 11A through 11D. In all of these cases, N=8 and $\theta=40$. The integer variable n has respective values of 4, 5, 6, and 7 in the respective cases. FIG. 11C is the optimum full overlap case.

In FIG. 11A, n=4 and $F_L=320$ and $F_H=640$. The output frequency range 320 to 640 MHz is the required 320 MHz range and it is achieved with five LO frequency signals as indicated. Redundant frequency coverage exists in this case, i.e. two Σ bands cover the same range as two Δ bands. The 1×2 spur bands are indicated by dotted lines and begin at the edge of each Σ and Δband.

The case for n=5 is shown in FIG. 11B. The input frequency range is 480 to 800 MHz. The output frequency range is greater than that required, i.e. 820−460=360 MHz. Redundant frequency coverage again exists with one Δ and one Σ band covering the same frequency range. The 1×2 spur bands are further away from the desired Σ and Δ bands.

In the optimum case shown in FIG. 11C, n=6 and $F_L=640$ and $F_H=960$. Again, the output frequency range is greater than that required, i.e. 1000−600=400 MHz. There are no redundant bands and the maximum points of the Δ bands just touch the minimum points of the Σ bands. The 1×2 spur bands are still further away from the desired Σ and Δ bands. Output filters can be multiplexed, i.e. Σ bands paired and Δ bands paired, if the 1×2 spurs are acceptable at band edges.

In the case of FIG. 11C, the input range $F_L$ to $F_H$ is covered by:

$$2F_L/N + N\theta/2 = 2(80) + 4(40) = 320$$

For such:

$$2F_L/N = N\theta - N\theta/2 = N\theta/2$$

$$2F_L/N = N\theta/2$$

$$F_L = \theta N^2/4$$

Applying EQUATION F: $F_L = N\theta(n-2)/2$

Therefore: $F_L = \theta N^2/4 = N\theta(n-2)/2$ $$2\theta N^2 = 4N\theta(n-2)$$

EQUATION K $N = 2(n - 2)$   OPTIMUM FULL OVERLAP (EVEN VALUES FOR N)

The case shown in FIG. 11D is for n=7 and $F_L=800$ and $F_H=1120$. Six LO frequencies are required to obtain an output frequency range that includes the input frequency range. The 1×2 spur bands are still further away, demonstrating again the principle that a larger n provides better spur performance. Further, Σ and Δ band pairings are facilitated for filter simplification.

Figure 11E:
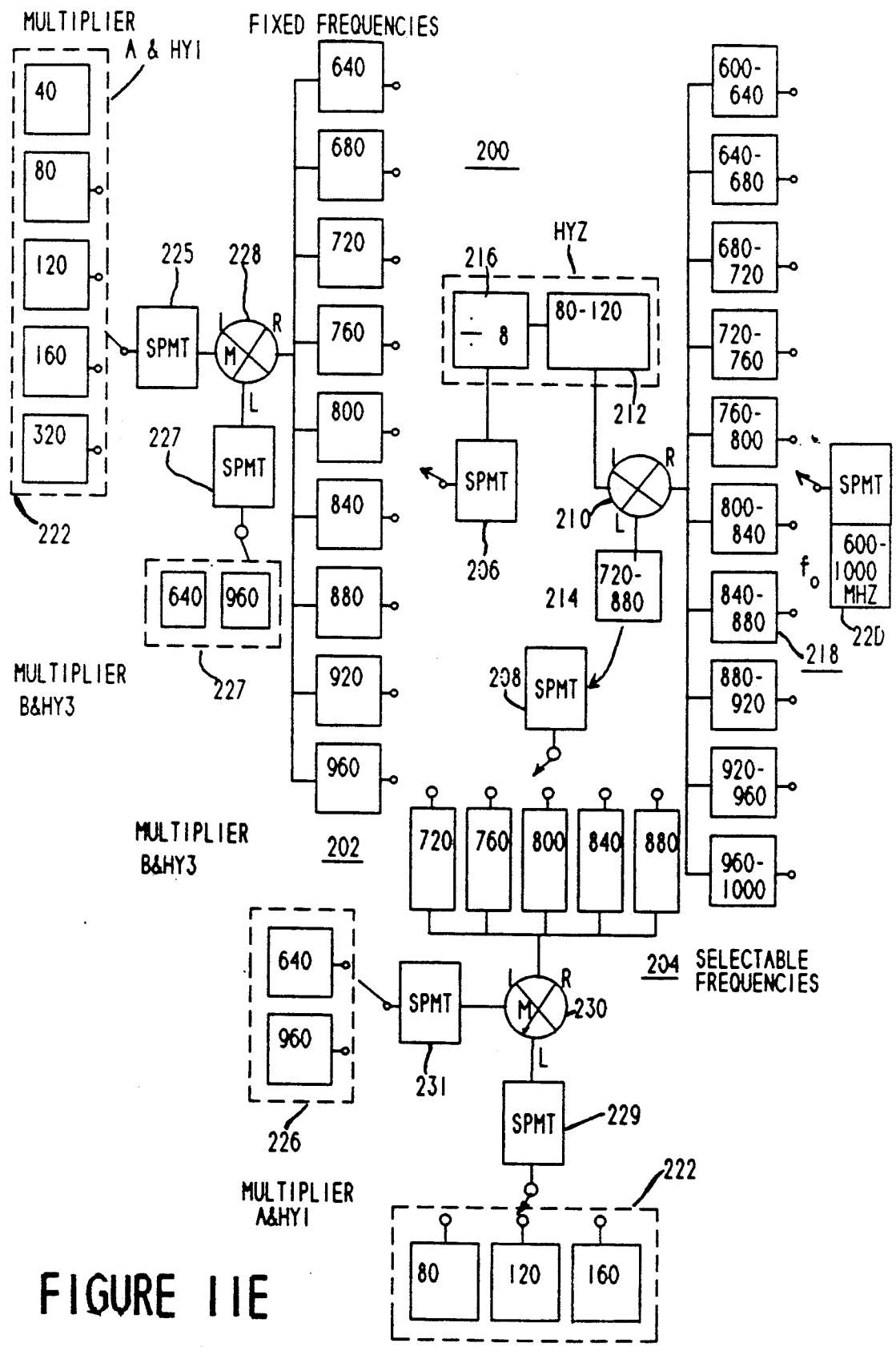
FIG. 11E shows a detailed block diagram of a prototype of the optimum full overlap non-octave embodiment of the invention shown in FIG. 11C1.

The case of FIG. 11C is implemented in an embodiment of the invention shown in FIG. 11E. Thus, a DF synthesizer 200 implements an optimum full overlap pattern. Optimum tuning range is achieved because the difference bands touch the sum bands at only one point, at the center LO frequency, with the use of (N/2 +1) LO frequencies. As already indicated in EQUATION K, optimum tuning range is achieved in the full overlap case by making N an even value equal to 2(n−2).

The following table lists some operating optimum full overlap combinations of N and n:

| N | n |
|---|---|
| 4 | 4 |
| 6 | 5 |
| 8 | 6 |
| 10 | 7 |
| 16 | 10 |
| 20 | 12 |

In the synthesizer 200, N=8 and n=6.

In this case, the synthesizer has a single stage and it includes a fixed frequency source 202 and a selectable LO frequency source 204. The fixed frequency source 202 provides nine fixed frequency signals as indicated and the selectable frequency source 204 provides five fixed LO frequency signals. Respective SPMT switches 206 and 208 connect the particular signals needed for a selected output frequency signal.

The switches 206 and 208 couple the respective frequency signals to the I and L ports of a mixer 210 through respective bandpass filters 212 and 214. A divider 216 having a divisor 8 is connected in the series path for the I fixed frequency as shown.

A total of ten parallel output filters, valued as shown, are connected in a bank 218 to the output of the mixer 210. An output SPMT switch 220 is connected to the particular filter needed to generate the selected output frequency signal $f_o$.

To reduce and limit the number of leak-through fixed frequency signals, the frequency sources 202 and 204 each outputs a single frequency signal for any one selected synthesizer output frequency. All other available frequency source signals are zero and thus can supply no leak-through signals. When the selected synthesizer frequency is changed, the two existing frequency signal are turned off and two new ones are turned on to supply the new selected output frequency signal.

The two input fixed frequency signals applied to the mixer 210 for any one output signal are supplied from a primary frequency source that supplies constant lower frequency signals. The primary signals are derived from a single master oscillator (not shown) which preferably is employed in this and all other embodiments of the invention. Because the primary frequencies are lower in the frequency spectrum, they present no leak-through problems.

The fixed I frequency signals are produced by beating the indicated primary signals against constant frequency signals shown in block 224 in a mixer 228. Respective SPMT switches 225 and 227 select the particular frequency signals needed to produce the I fixed frequency signal in turn needed for the selected synthesizer output frequency. Filter block 240 prevents leakage of the 640 and 960 MHz frequency signals to the output.

Similarly, the selectable LO frequency signals are produced by beating the indicated primary signals against constant frequency signals shown in block 226 in a mixer 230. Respective SPMT switches 229 and 231 provide the signal selection needed to produce the LO frequency required for the selected synthesizer output frequency.

The net effect of the improved frequency source circuitry shown in FIG. 11E is that a significantly reduced number of possible in-band leak-through fixed frequency signals is realized since fewer in-band fixed frequency signals are on at any one time. As a result, filter selection for leak-through rejection is facilitated.

FIG. 11F shows the output filter characteristics and the frequency placement of the mixer products for the optimum full overlap DF synthesizer 200. As shown, the $\Sigma$ and $\Delta$ bands touch at only one point, i.e. at the band midpoint 800 MHz. Leakage LO signals and $1 \times 2$ birds are rejected by the output filter bank.

A circuit layout for a prototype 200P of the optimum full overlap synthesizer 200 is shown in FIG. 11F. A logic control 240 sets all of the single pole switches as required to produce a selected synthesizer output frequency at output terminal 240. The output filters are indicated in block 244. Fixed I frequencies and fixed LO frequencies are supplied to mixer 210P from respective filter blocks 212P and 214P. Other detailed and blocked in components, such as multipliers A and B are designated on FIG. 11F, In general, solid state components are employed where appropriate.

Design parameters for the prototype synthesizer 200P include:

$N = 8$
$n = 6$
$p = 3$
$\theta = 40$
$D = 40$
$\delta = 5$

From a performance standpoint, test operation of the broad band prototype 200P showed extremely fast operation, extremely low phase noise and extremely low spur levels. Graphs in FIGS. 15A-15H illustrate the improved performance.

Figure 15A:
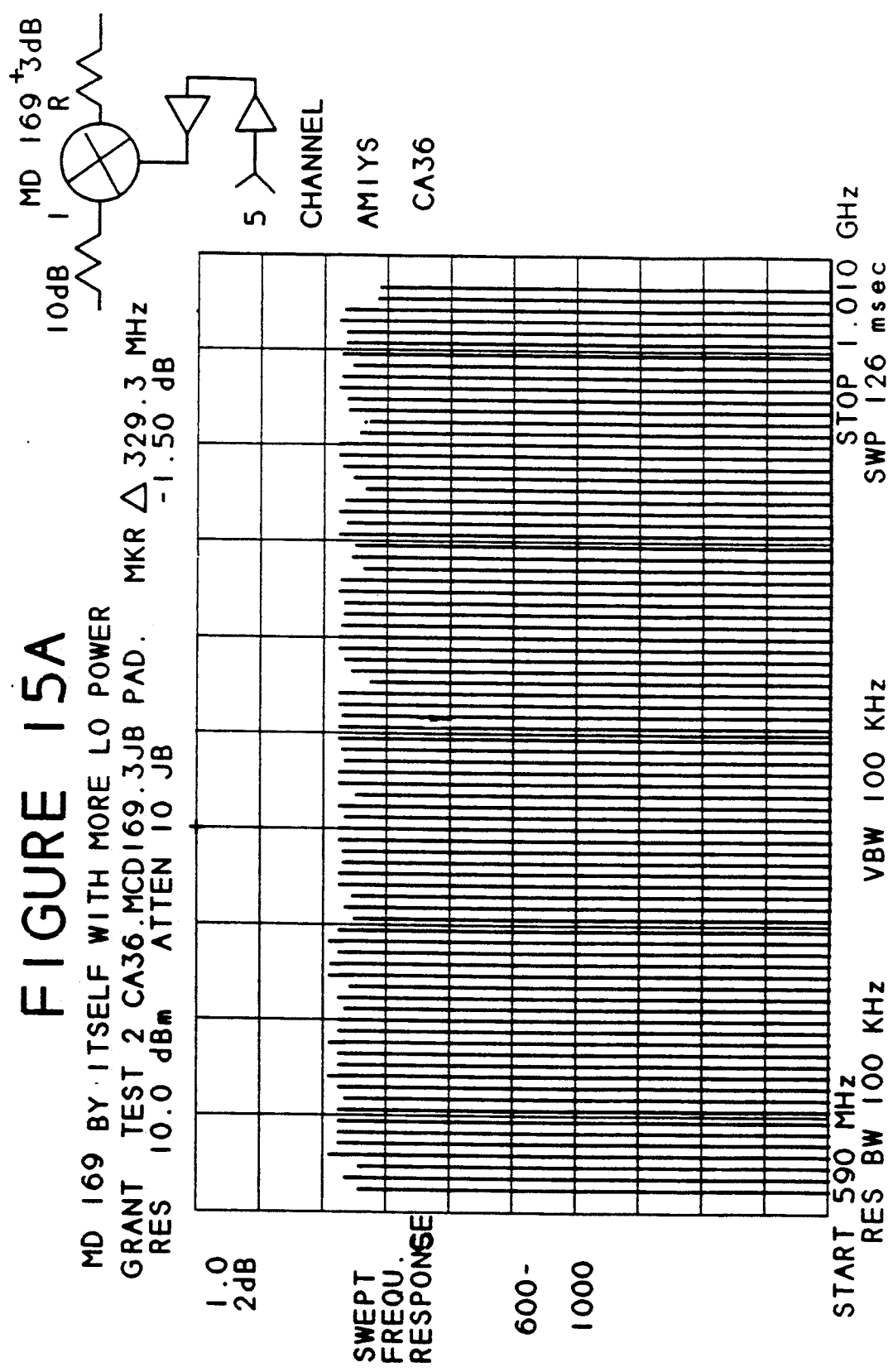

A swept frequency response graph is shown in FIG. 15A. It shows the selectable individual output frequency signals generated by the prototype synthesizer of FIGS. 11F1-11F2 the output frequency band 600 MHz to 1000 MHz. The signals are spaced from each other by 5 MHz frequency steps.

In FIG. 15B, there is illustrated a representative output frequency switching operation for the prototype. Thus, output signal 300 is switched off at 302 and the switching response is completed in less than 100 nanoseconds.

Figure 15C:
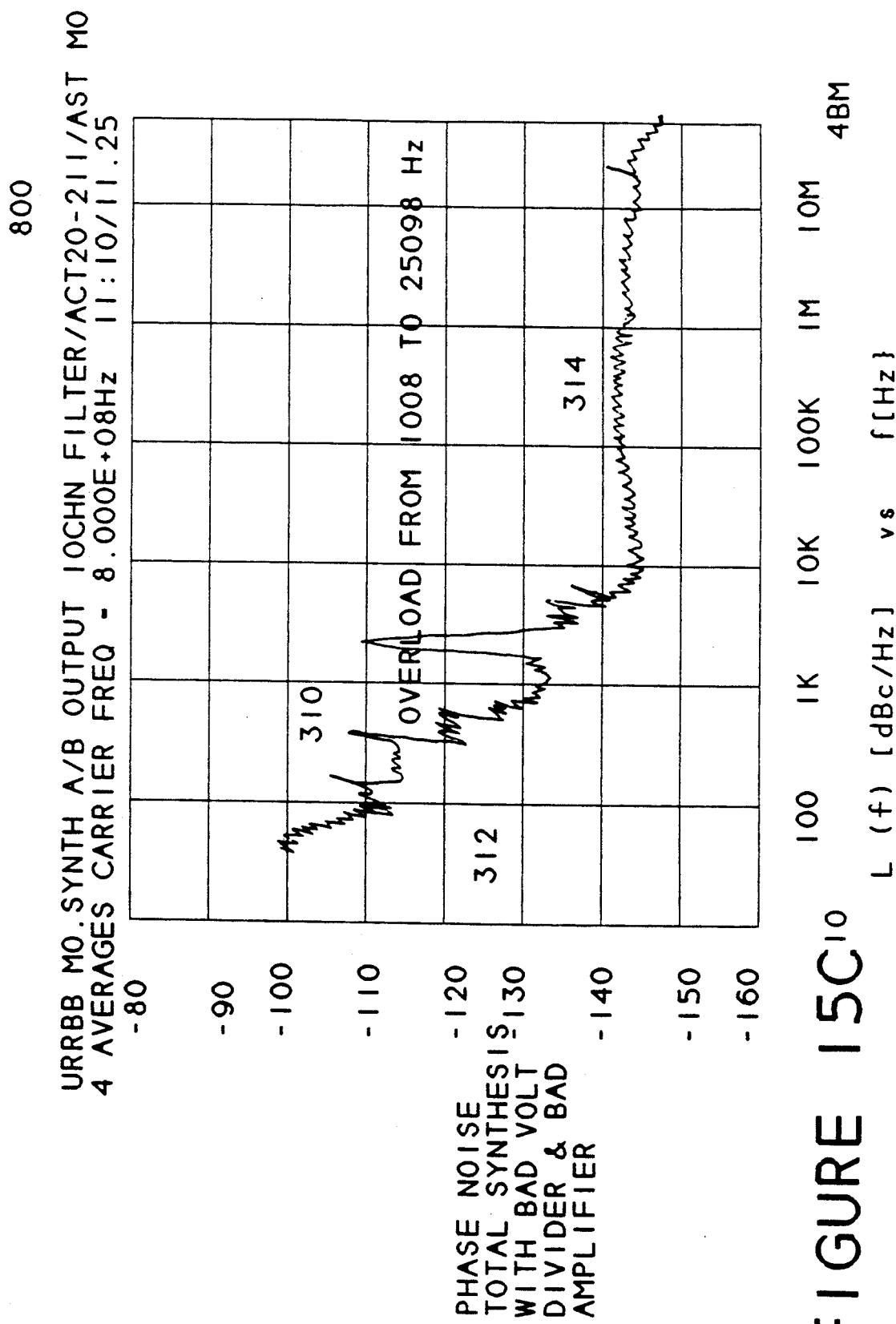
Figure 15D:
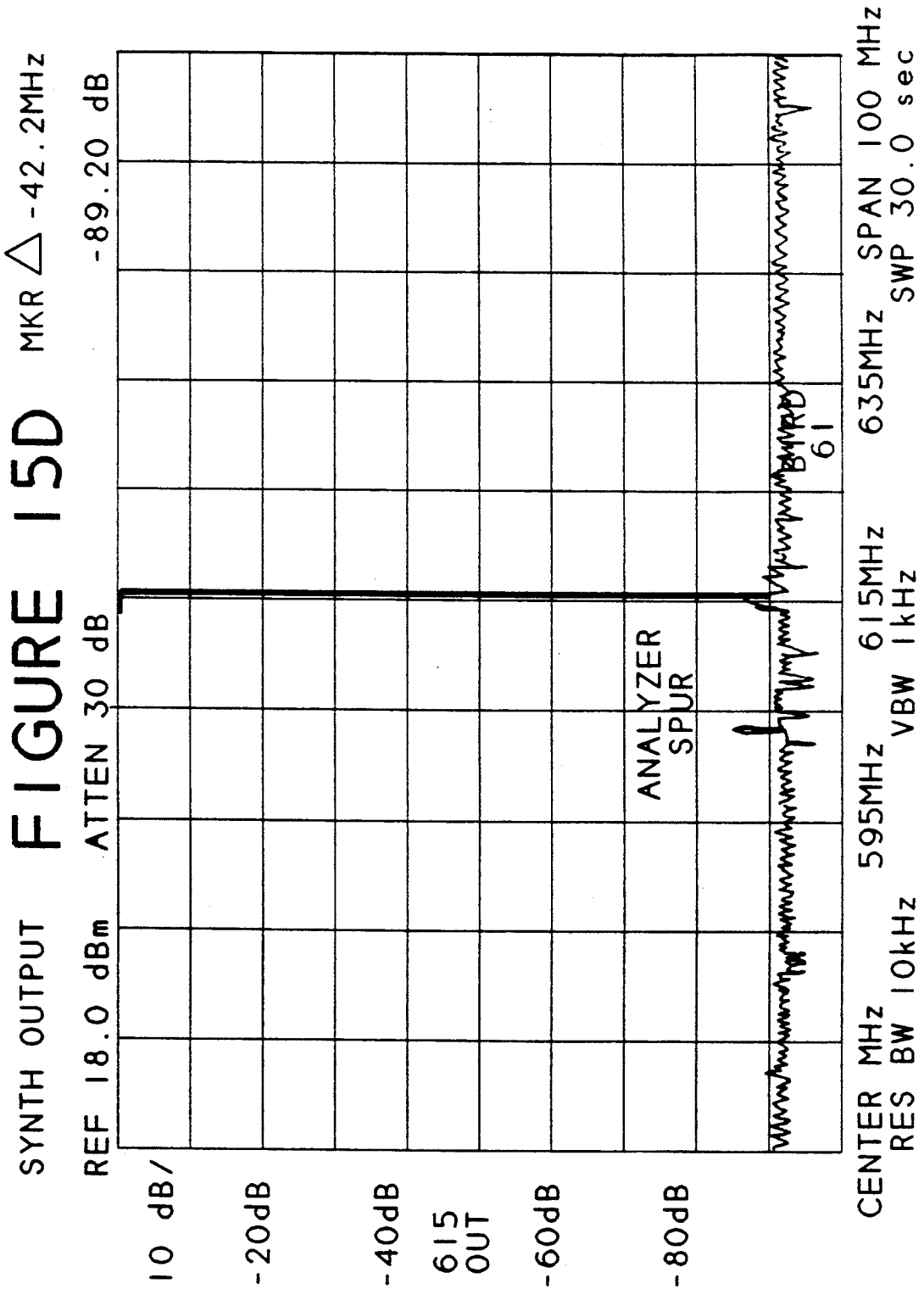
Figure 15G:
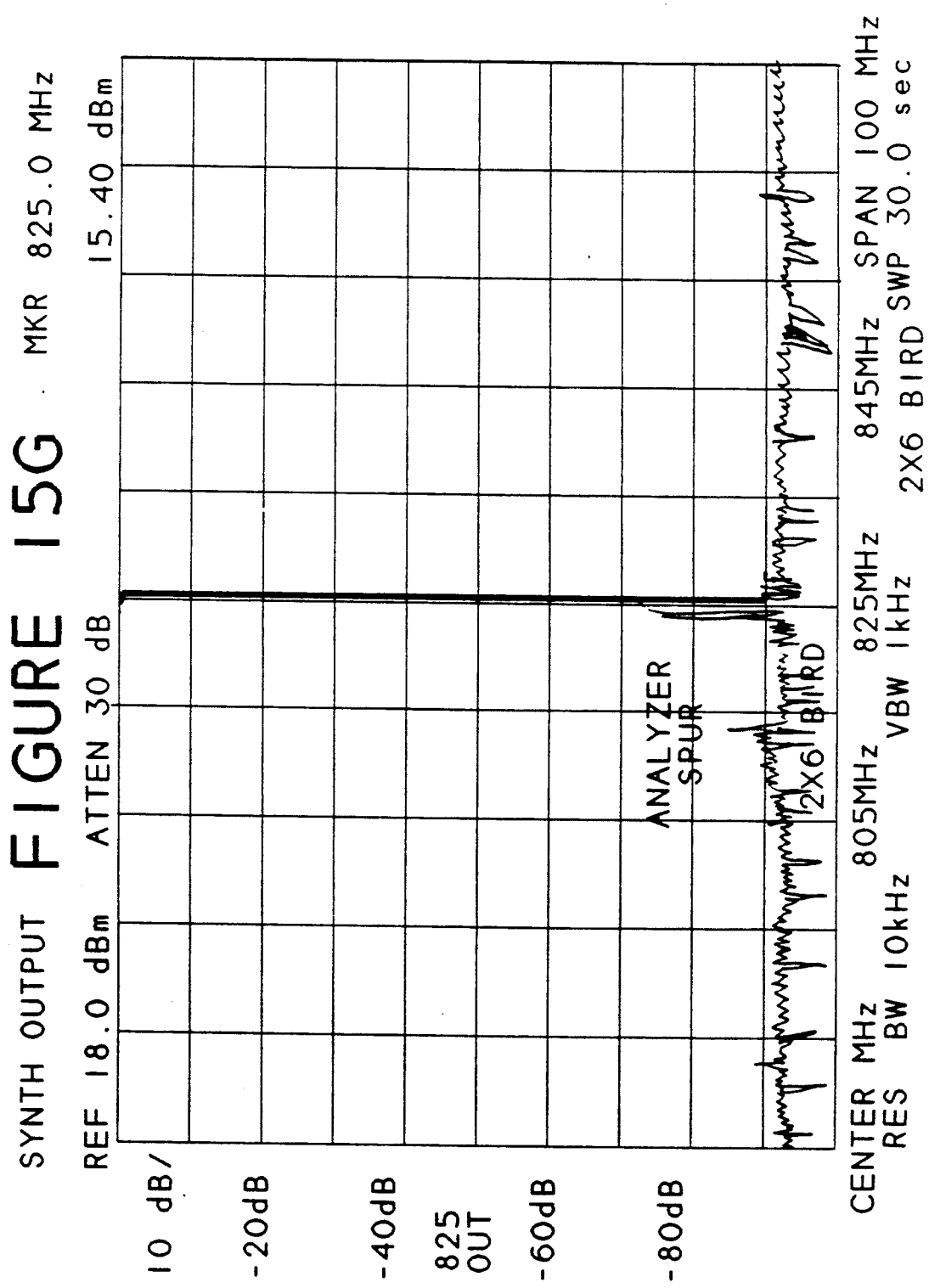

A phase noise characteristic 310 is shown in FIG. 15C for a 40 MHz span above the synthesizer frequency 800 MHz. A similar curve applies to the 40 MHz span below 800 MHz. A nearby segment 312 from 10 Hz to 1000 Hz is not critical for radar applications since Doppler return signals are normally located more than 1000 Hz from the transmitted frequency signal, i.e. normally would be located on floor portion 314 of the curve 310.

The phase noise performance of the prototype unit of FIGS. 11F1-11F2, i.e. 145 dB below the carrier, is better than known prior art phase noise performance. This improvement resulted even though, as determined after testing, that a divider and an amplifier used in the prototype were off-specification from a phase noise standpoint. Future testing with on-specification hardware units is expected to show a significantly lower level for the nearby curve segment 312 and a noise floor 314 lowered by at least an added 5 dB from $-145$ dB to $-150$ dB.

FIGS. 15D-15H show the output of the FIGS. 11F1-11F2 prototype for each of five different selected output frequency signals: 615, 620, 820, 825 and 980 MHz. Each graph shows a 100 MHz output frequency span with the selected output frequency signal centered within the span. As indicated, a single spur in each of FIGS. 15D-15h originated in the analyzer used for measurement, and not in the synthesizer prototype itself.

The noise floor for all frequency output signals is $-90$ dB or lower. No distinguishable synthesizer spurs accompany any of the output frequency signals. The closest calculated synthesizer spur in each case has such a low amplitude that it is indistinguishable. Each closest spur is marked on the respective graphs to show its frequency location. Other calculated and further removed synthesizer spurs are also indistinguishable with even lower amplitudes.

Figure 12A:
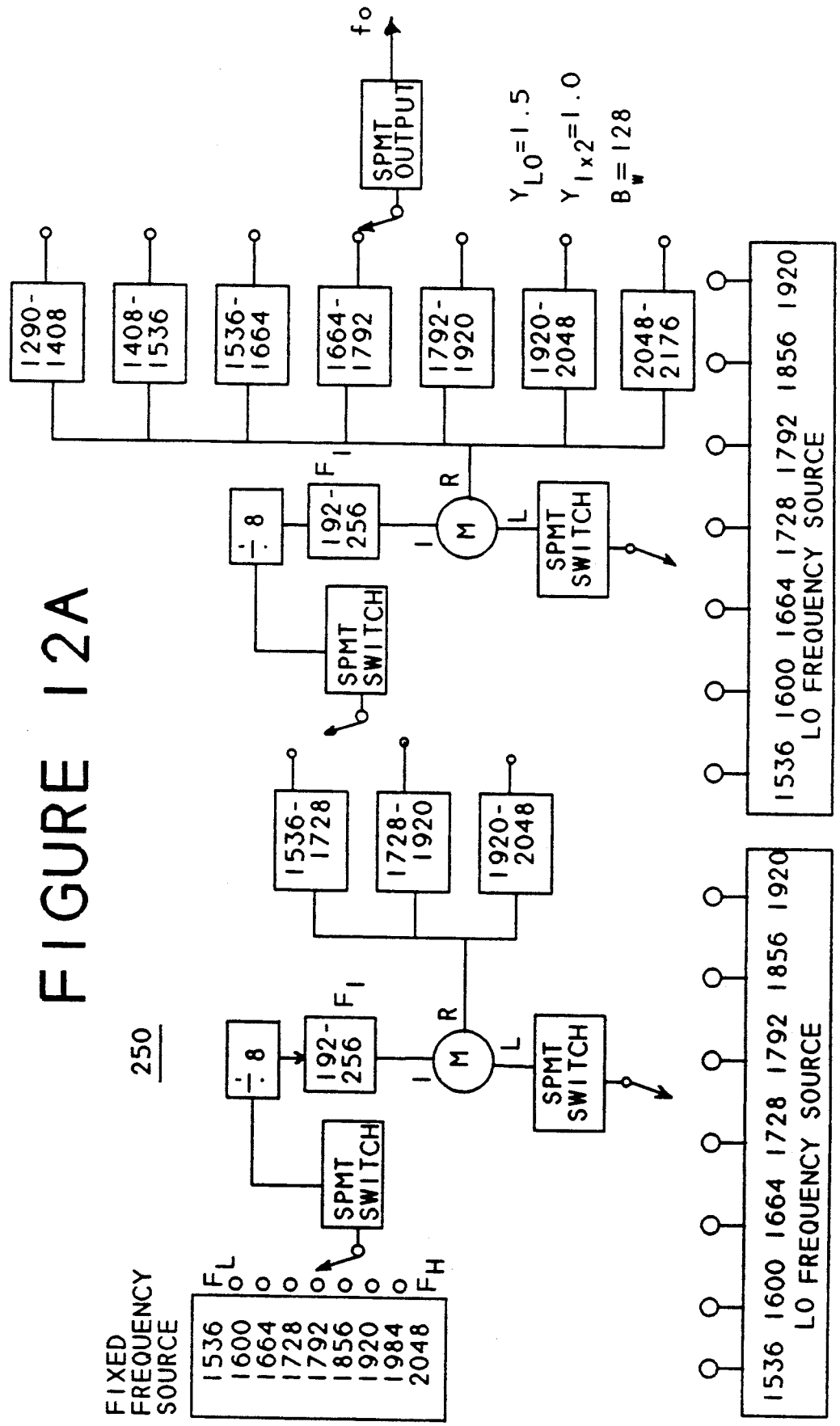
FIG. 12A shows a block diagram for another non-octave full overlap synthesizer arranged in accordance with the invention.

Another full overlap embodiment of the invention is shown in FIG. 12A as further illustration of the application of the basic equations defined herein in accordance with the invention. In this case, $N=8$ and $\theta=64$ and $n=8$ to provide a two-stage synthesizer 250 having a relatively high $F_1$ frequency. Filter multiplexing is provided in both stages.

Figure 12B:
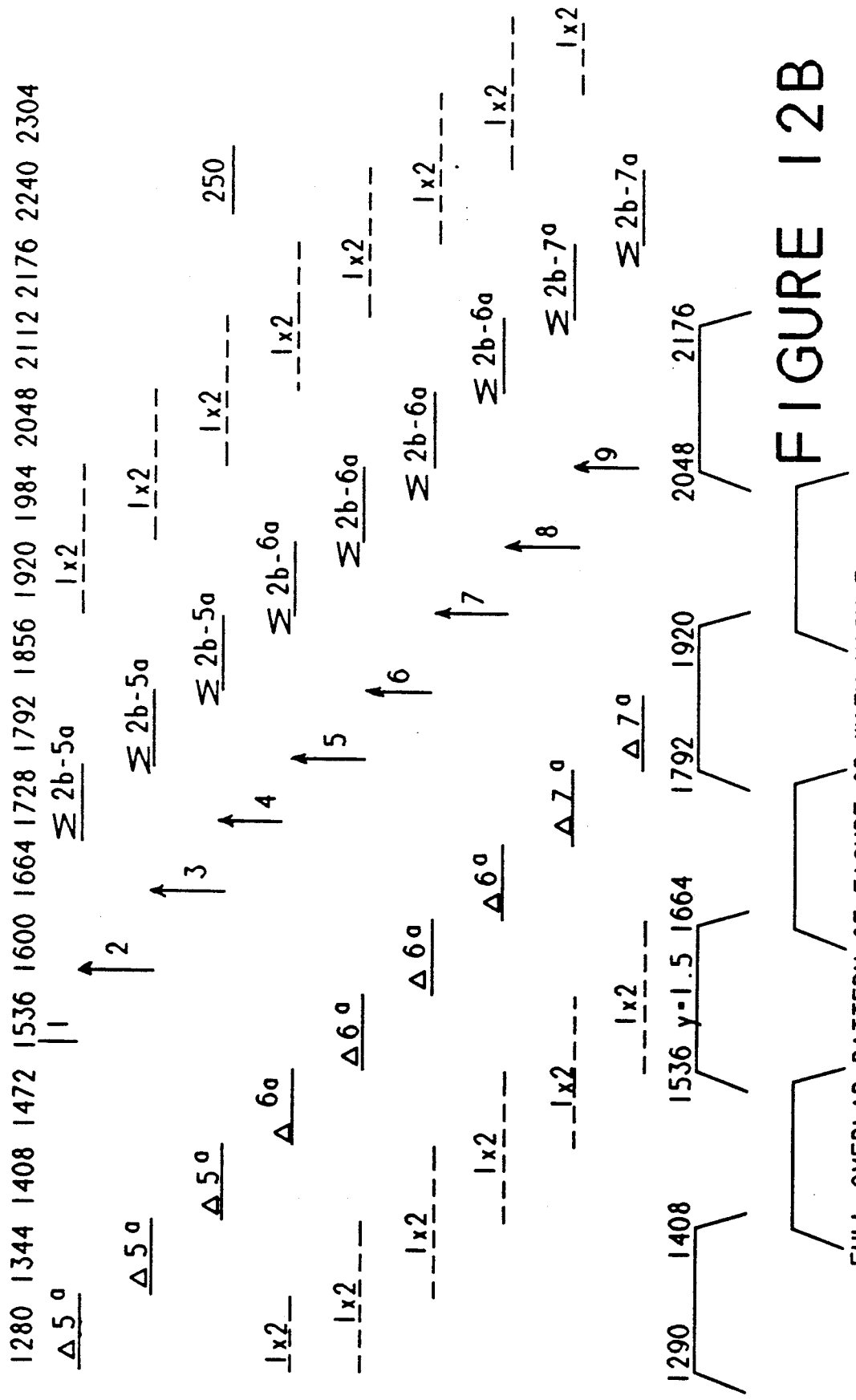
FIG. 12B graphically illustrates the frequency pattern with filter multiplexing for the synthesizer of FIG. 12A.

FIG. 12B shows the frequency pattern for the synthesizer 250. Since two $\Sigma$ bands cover two $\Delta$ bands, seven fixed selectable frequencies are needed to provide continuous output frequency coverage. The shape factors for each filter band are YLO=2.50 and Y1×2 =1.50. Filter multiplexing is provided for the output filters.

COMPARATIVE EVALUATION—HALF OVERLAP AND FULL OVERLAP PATTERNS

Various general conclusions can be drawn from a comparison of the half overlap and full overlap patterns employed in DF synthesizers in accordance with the invention to generate a desired band of output frequencies. These conclusions include:

a. Output filter bandwidth increases as $\theta$ increases or N decreases.

b. For a given $\theta$, $F_L$ and $F_H$ and all frequencies increase as n increases.

c. Filter shape factor Y (explained subsequently herein) increases and output filters become more combinable as n increases.

d. Full overlap requires fewer LO frequencies to tune a given bandwidth for n equal to or greater than 3.

e. For a given n, the half overlap pattern yields a better filter shape factor Y.

f. The full overlap pattern is more adaptable for extending the tuning range.

g. The full overlap pattern enables a narrower bandwidth multiplier for frequency multiplication described more fully subsequently herein.

h. Full overlap requires more fixed frequency divider frequencies: (N+1) versus (N/2 +1).

i. Mixer birds (spurs) are about the same for both cases.

j. Full overlap allows use of output filters that require a steep skirt on only one side of the filter characteristic.

Figure 13:
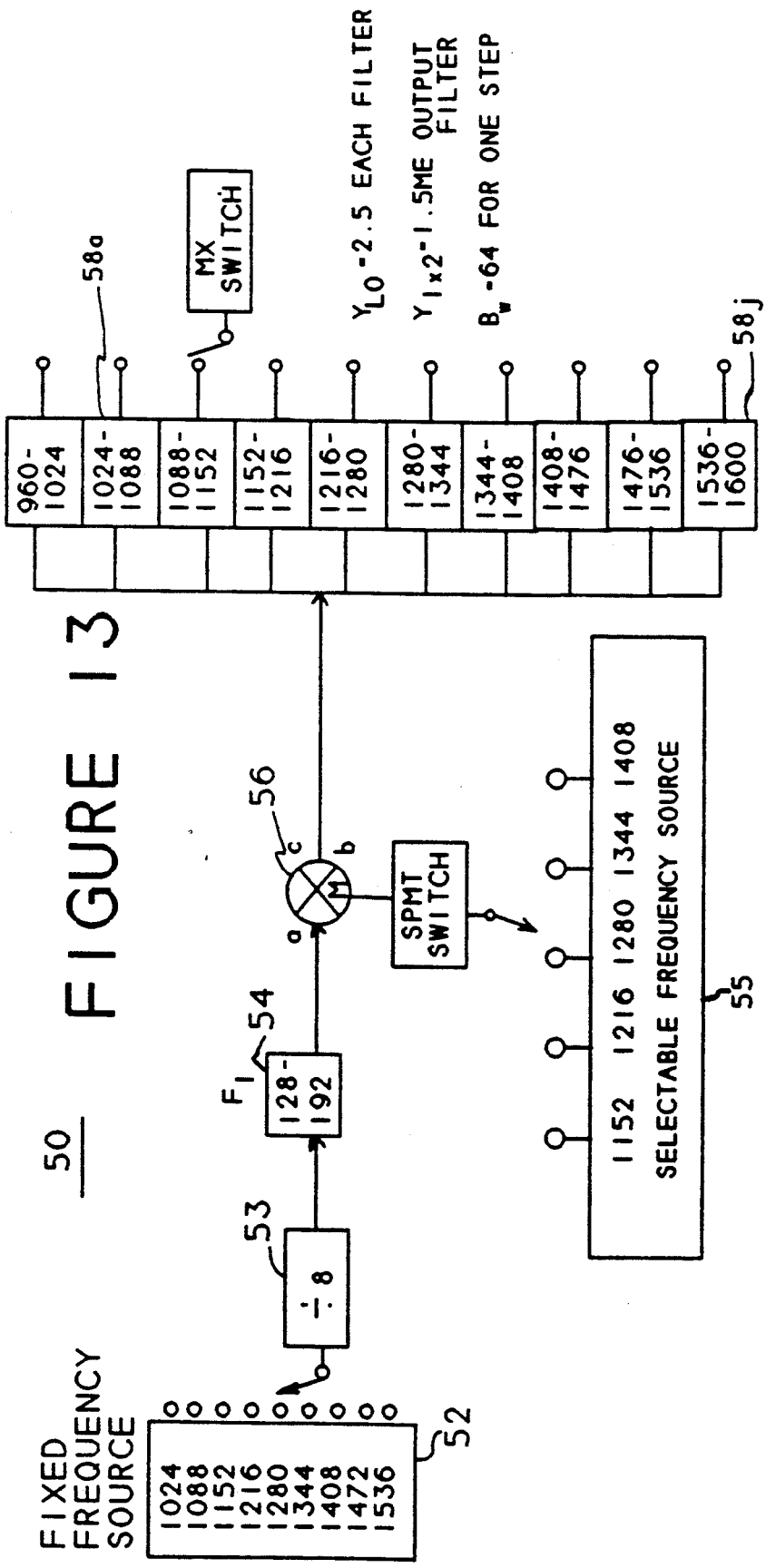
FIG. 13 shows a block diagram of another full overlap synthesizer embodied in accordance with the invention.
Figure 14:
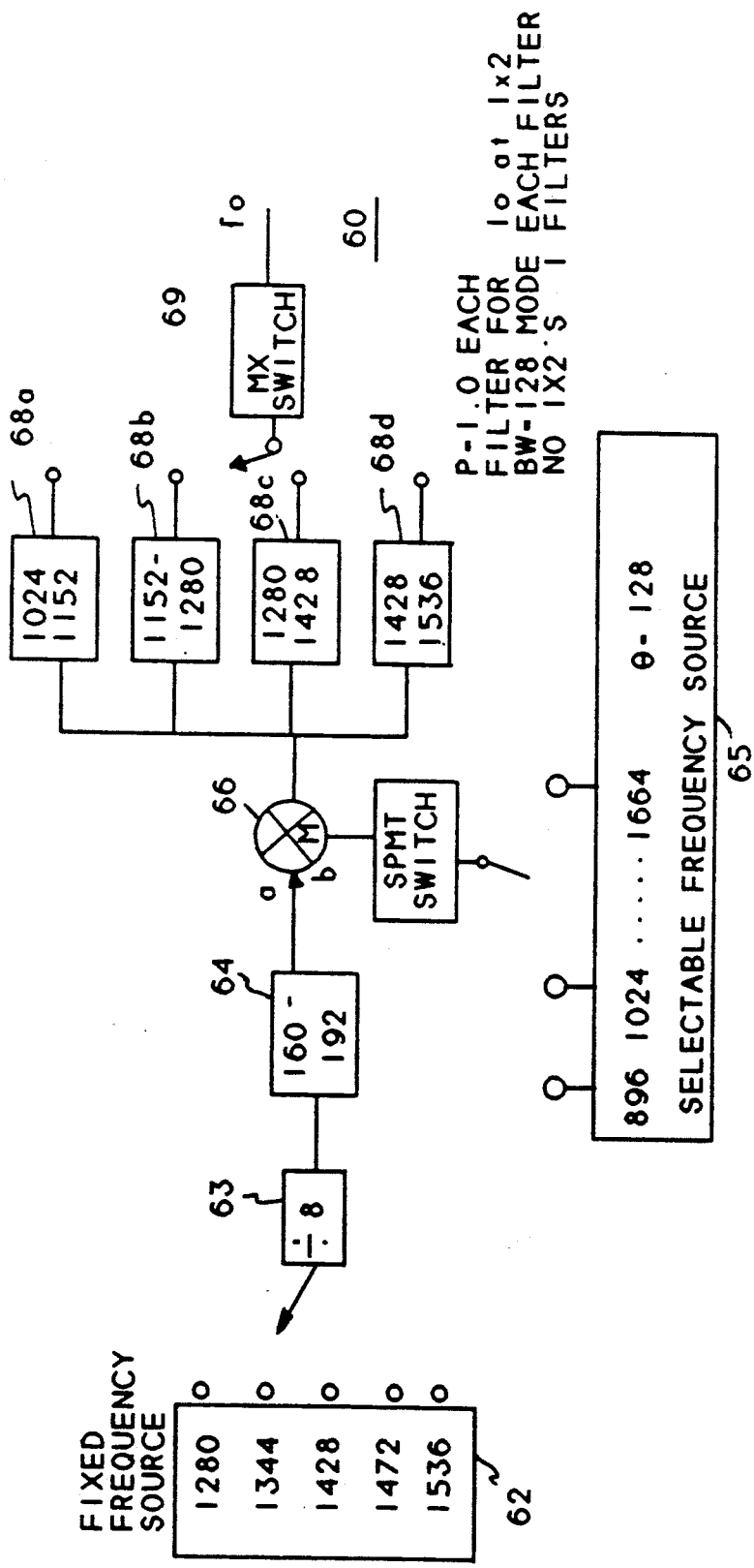
FIG. 14 shows a block diagram of another half overlap synthesizer embodied with filter multiplexing in accordance with the invention.

The conclusion (d.) above is illustrated by additional embodiments of the invention shown in FIGS. 13 and 14. Thus, a nonoctave full overlap synthesizer stage 50 (FIG. 13) and a nonoctave half overlap synthesizer stage 60 (FIG. 14) are both structured in accordance with the invention to generate output frequencies over the range 1024 MHz to 1536 MHz.

In the full overlap synthesizer 50, an input fixed frequency source 52 supplies nine fixed frequencies as shown. On the other hand, in the half overlap synthesizer 60, an input fixed frequency unit 62 supplies five fixed frequencies over half of the frequency range covered by the full overlap stage 50. In both synthesizers 50 and 60, the divisor N is 8 as shown in respective blocks 53 and 63.

A filter 64 for the half overlap synthesizer 60 passes half of the frequency range passed by a filter 54 in the full overlap synthesizer 50, and in particular it passes the upper half of the frequency range. As a result, the center frequency of the filter 64 is relatively higher thereby driving second harmonic "birds" from half overlap mixer 66 higher relative to the synthesizer output frequency range. With the output bands multiplexed into four output filters 68a through 68d in the half overlap synthesizer 60, the output frequency range 1024 MHz to 1536 MHz can be tuned with no in-band 1×2 mixing products which otherwise are typically the most troublesome "birds" to avoid. The output frequency bands are multiplexed into four filters.

A selectable frequency source 55 applies five LO frequencies to mixer 56 in the full overlap synthesizer 50, whereas a selectable frequency source 65 applies thirteen LO frequencies to the mixer 66 in the half overlap synthesizer 60.

Although the full overlap synthesizer 50 has more output filters, i.e. ten output filters 58a through 58j, it is simpler to mechanize since it requires a.) fewer fixed LO frequencies and the output filters can be multiplexed into five or six filters to cover 1024 to 1536 MHz. The advantage of fewer selectable LO frequencies is magnified in synthesizers having cascaded stages since each stage requires all of the selectable frequencies as mixer inputs, and in this example only five selectable frequencies are thus required for each stage in a cascaded unit.

It is also noteworthy that as $F_L$ is raised to improve the individual output filter shape factor Y, and to move the bands for mixer second harmonic spurs further from the desired synthesizer output band, the desired $\Sigma$ and $\Delta$ mixing bands spread further apart with less overlapping of bands. Accordingly, the half overlap pattern approach is not practical for a relatively low number of selectable LO frequencies since the bands do not overlap as required for full frequency coverage as previously described.

The synthesizer 50 achieves maximum tuning range of 640 MHz with five fixed LO frequencies because the $\Sigma$ and $\Delta$ patterns touch only at the centerpoint (1280 MHz) of the tuning band. Accordingly, optimum use is uniquely made of the five fixed LO frequencies. Further, the tuning range can be extended with additional fixed LO frequencies.

With respect to conclusion (j.) above, the permitted use of micro-miniature output filters having a steep skirt on only side of the filter characteristic is significant since synthesizer output filters can accordingly be smaller, less costly and selected from catalogs. From a size standpoint, the microminiature filter typically is only 1.5 inches long whereas the tubular filter required for two-sided steep skirt applications is 3.55 inches long.

Generally, where the particular frequency pattern being implemented permits, the filters are selected and multiplexed so that undesired nearby leak through LO birds and undesired nearby mixing sideband signals appear on the same skirt of the filter. The other filter skirt can thus be less steep since signals to be blocked are substantially further away from it.

For the nonoctave synthesizer embodiment of the invention shown in FIG. 13, the output frequency is tunable from 960 MHz to 1600 MHz with use of a single frequency divider filter for the filter means 54. The single frequency divider filter has a center frequency of 160 MHz and the 1×2 spur bands are 64 MHz minimum away from the desired $\Sigma$ and $\Delta$ bands.

Various modifications and variations can be made in the improved direct frequency synthesizer of the present invention by those skilled in the pertaining art without departing from the scope and spirit of the invention. It is accordingly intended that the present invention embrace such modifications and variations to the extent they come within the scope of the appended claims and their equivalents.

What is claimed is:

1. A direct frequency synthesizer comprising:
   means for generating a set of fixed frequency signals from $F_L$ to $F_H$ which define a frequency band B, the successive signals in said fixed frequency signal set being spaced from each other by a frequency increment D;
   means for dividing said fixed frequency signals by a divisor N;
   first filter means for passing said fixed frequency signals and rejecting undesired signals after division by said divider means and for rejecting undesired signals outside said band B;
   means for generating a set of selectable LO frequency signals from $f_1$ to $(f_1+j\theta)$ with the successive signals in said selectable LO frequency signal set being spaced from each other by a frequency increment $\theta$;
   means for mixing sad fixed frequency signals from the output of said first filter means and said selectable LO frequency signals to generate mixer product signals;
   first means for selectively coupling one of said fixed frequency signals and one of said selectable LO frequency signals to said mixing means for each selected synthesizer output frequency signal;
   output filter means coupled to the output of said mixing means and including a plurality of interconnected output filters for rejecting undesired signals and an output where the selected synthesizer output frequency is generated within a synthesizer output frequency band $F_1$ through $F_i$;
   second means for selectively coupling the output of said mixing means through one or more of said output filters to said filter output in accordance with the selected output frequency; and
   said frequency signals $F_H$ and $F_L$ being valued to provide continuous output frequency coverage in accordance with a first predetermined relationship among the parameters N, n, and $\theta$ where n is equal to an integer one less than the number of LO frequencies in the frequency span associated with the touching of the highest edge of a mixing means sum band and the lowest edge of a mixing means difference band.

2. The direct frequency synthesizer of claim 1 wherein continuous output frequency coverage is provided in accordance with a half overlap frequency pattern defined by equations $F_L = N\theta(n-1)/2$ and $F_H = nN\theta/2$.

3. The direct frequency synthesizer of claim 1 wherein continuous output frequency coverage is provided in accordance with a full overlap frequency pattern defined by equations $F_L = N\theta(n-2)/2$ and $F_H = nN\theta/2$.

4. The direct frequency synthesizer of claim 1 wherein said output frequency band equals said input frequency band B to characterize said synthesizer with stage cascadability, said parameters N, n, and $\theta$ having a second predetermined relationship so that $F_L = F_1$ and $F_H = F_i$.

5. The direct frequency synthesizer of claim 2 wherein said output frequency band equals said input frequency band B to characterize said half overlap synthesizer with stage cascadability in accordance with an equation $$f_1 = \theta \frac{[(n-1)(N-1) \pm r]}{2}$$

where r is an integer.

6. The direct frequency synthesizer of claim 3 wherein said output frequency band equals said input frequency band B to characterize said full overlap synthesizer with stage cascadability in accordance with an equation $$f_1 = \theta \frac{[(n-2)(N-1) + p]}{2}$$

where p is an integer.

7. A direct frequency synthesizer comprising:
   A.) means for generating a set of fixed input frequency signals from $F_L$ to $F_H$ which define a frequency band B, the successive signals in said fixed frequency signal set being spaced from each other by a frequency increment D; and
   B.) a plurality (x) of cascaded stages, each of said stages having
      a. means for dividing said fixed input frequency signals by a divisor N;
      b. first filter means for passing said fixed input frequency signals and rejecting undesired signals after division by said divider means and for rejecting undesired signals outside said band B;
      c. means for generating a set of selectable LO frequency signals from $f_1$ to $(f_1+j\theta)$ with the successive signals in said selectable LO frequency signal set being spaced from each other by a frequency increment $\theta$;
      d. means for mixing said input frequency signals after filtered by said first filtered means and said selectable LO frequency signals to generate mixer product signals;
      e. first means for selectively coupling one of said input frequency signals and one of said selectable LO frequency signals to said mixing means for each selected synthesizer output frequency signal;
      f. output filter means coupled to the output of said mixing means for rejecting undesired signals and having a stage output; and
   C.) said generating means being coupled to the input of said dividing means of the first stage to apply said fixed frequency signals as said input frequency signals;
   D.) said stage output of each of said stages except the x stage being coupled to transmit input frequency signals to said dividing means of the next stage;
   E.) said output filter means for said x stage having a plurality of interconnected output filters for rejecting undesired signals and an output where the selected synthesizer output frequency is generated within a synthesizer output frequency band $F_1$ through $F_i$;
   F.) second means for selectively coupling the output of said mixing means of said x stage through one or more of said x stage output filters to said x stage filter output in accordance with the selected output frequency;
   G.) said frequency signals $F_H$ and $F_L$ being valued to provide continuous output frequency coverage in accordance with a first predetermined relationship among the parameters N, n, and $\theta$ where n is equal to an integer one less than the number of LO frequencies in the frequency span associated with the touching of the highest edge of a mixing means sum band and the lowest edge of a mixing means difference band; and H.) said parameters N, n and $\theta r$ having a second predetermined relationship so that $F_L=F_1$ and $F_H=F_i$.

8. The direct frequency synthesizer of claim 7 wherein the structure defined in subparagraph B is substantially identical for all of said stages.

9. The direct frequency synthesizer of claim 7 wherein no more than a single mixer is included in each of said mixer means.

10. The direct frequency synthesizer of claim 1 wherein filter shape factor Y is defined as a frequency to be rejected minus the center output filter frequency all divided by the output filter 3 db bandwidth, and wherein Y has a relatively increased value to simplify output filtering with a relatively increased value for $F_L$ and a relatively decreased value of the output filter bandwidth.

11. The direct frequency synthesizer of claim 2 wherein filter shape factor Y is defined as a frequency to be rejected minus the center output filter frequency all divided by the output filter 3 db bandwidth, and wherein $Y=F_L/N(BW)$.

12. The direct frequency synthesizer of claim 3 wherein filter shape factor Y is defined as a frequency to be rejected minus the center output filter frequency all divided by the output filter 3 db bandwidth, and wherein $Y=(F_L+F_H)/2N(BW)$.

13. The direct frequency synthesizer of claim 7 wherein the value of N is made relatively high for spur reduction.

14. The direct frequency synthesizer of claim 7 wherein increased spur reduction is realized with a relatively increased value of n.

15. The direct frequency synthesizer of claim 7 wherein increased $1\times 2$ spur reduction is realized with said first filter means having a relatively high center frequency and with $F_H$ less than two times $F_L$.

16. The direct frequency synthesizer of claim 1 or 7 wherein multiplier means is coupled to the last filter output, said multiplier means comprising:

a multiplier device having a multiplication factor of N;

third means for selectively coupling one of said selectable LO frequency signals to said multiplier device;

multiplier stage means for mixing frequency signals from said filter output with multiplied LO frequency signals from said multiplier device; and multiplier stage output filter means coupled to the output of said multiplier stage mixing means to generate frequency signals within a multiplied synthesizer output frequency band $NF_L$ through $NF_H$.

17. The direct frequency synthesizer of claim 1 or 7 wherein said divider means in the first stage includes:

respective divider devices each having a divisor N and having inputs to which said fixed frequency signals are respectively coupled; and wherein said first selective coupling means includes:

first switch means selectively connectable to the output of each of said divider devices to couple said fixed input frequency signals to said first filter means in said first stage such that phase memory is provided as said fixed frequency signals are selectively switched; and second switch means selectively connecting said LO frequency signals to said mixing means in said first stage.

18. The direct frequency synthesizer of claim 3 or 7 wherein N is even and $N=2(n-2)$ to provide optimum full overlap operation.

19. The direct frequency synthesizer of claim 7 wherein $N=8$ and $n=6$.

20. The direct frequency synthesizer of claim 7 wherein $N=10$ and $n=7$.

21. The direct frequency synthesizer of claim 7 wherein $N=8$ and $n=10$.

22. The direct frequency synthesizer of claim 22 wherein $N=8$ and $n=6$.

23. The direct frequency synthesizer of claim 7 wherein $f_1=F_L=N\theta/2$ and said fixed frequencies are the same as said selectable frequencies.

24. The direct frequency synthesizer of claim 2 wherein $f_1=F_L=N\theta/2$ and n equals 2 and said fixed frequencies are the same as said selectable frequencies.

25. The direct frequency synthesizer of claim 7 wherein continuous output frequency coverage is provided in accordance with a half overlap frequency pattern defined by the equations $F_L=N\theta(n-1)/2$ and $F_H=nN\theta/2$ and wherein $f_1=F_L=N\theta/2$ and said fixed frequencies are the same as said selectable frequencies.

26. The direct frequency synthesizer of claim 7 wherein $N=8$.

27. The direct frequency synthesizer of claim 7 wherein $N=10$.

28. The direct frequency synthesizer of claim 7 wherein $N=16$.

* * * * *